(12) United States Patent
Kusakabe et al.

(10) Patent No.: US 7,859,909 B2
(45) Date of Patent: Dec. 28, 2010

(54) NONVOLATILE SEMICONDUCTOR MEMORY DEVICE

(75) Inventors: Yoshihiko Kusakabe, Tokyo (JP); Kenichi Oto, Tokyo (JP); Satoshi Kawasaki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/546,062

(22) Filed: Aug. 24, 2009

(65) Prior Publication Data

US 2009/0310410 A1 Dec. 17, 2009

Related U.S. Application Data

(63) Continuation of application No. 12/216,489, filed on Jul. 7, 2008, now Pat. No. 7,596,033, which is a continuation of application No. 11/701,404, filed on Feb. 2, 2007, now Pat. No. 7,411,834.

(30) Foreign Application Priority Data

Feb. 3, 2006 (JP) ............... 2006-027010

(51) Int. Cl.
*G11C 16/06* (2006.01)
*G11C 16/04* (2006.01)

(52) U.S. Cl. ............ 365/185.23; 365/185.18; 365/185.27

(58) Field of Classification Search ......... 365/185.23
See application file for complete search history.

(56) References Cited

U.S. PATENT DOCUMENTS

| 5,311,479 | A | 5/1994 | Harada |
| 5,661,683 | A | 8/1997 | Song |
| 5,812,459 | A * | 9/1998 | Atsumi et al. .......... 365/185.23 |
| 6,207,998 | B1 | 3/2001 | Kawasaki et al. |
| 6,507,508 | B2 | 1/2003 | Hosono et al. |
| 6,839,283 | B1 | 1/2005 | Futatsuyama et al. |
| 6,865,114 | B2 | 3/2005 | Pio |
| 7,447,104 | B2 | 11/2008 | Leung |
| 2003/0033473 | A1 | 2/2003 | Blodgett |
| 2007/0297236 | A1 | 12/2007 | Tokiwa |
| 2008/0043538 | A1 | 2/2008 | Sugawara |

FOREIGN PATENT DOCUMENTS

| JP | 2001-28428 | A | 1/2001 |
| JP | 2003-141887 | A | 5/2003 |
| JP | 2004-185660 | A | 7/2004 |
| JP | 2005-243211 | A | 9/2005 |

\* cited by examiner

*Primary Examiner*—Son L Mai
(74) *Attorney, Agent, or Firm*—McDermott Will & Emery LLP

(57) ABSTRACT

A sub-decoder element provided corresponding to each word line is constructed by the same conductive type MOS transistors. The sub-decoder elements are arranged in a plurality of columns such that the layout of active regions for forming the sub-decoder elements is inverted in a Y direction and displaced by one sub-decoder element in an X direction. The arrangement of the sub-decoder elements is adjusted such that high voltage is not applied to both of gate electrodes adjacent in the Y direction. A well voltage of a well region for forming the sub-decoder element group is set to a voltage level such that a source to substrate of the transistor of the sub-decoder element is set into a deep reversed-bias state. In a nonvolatile semiconductor memory device, the leakage by a parasitic MOS in a sub-decoder circuit or word line driving circuit to which a positive or negative high voltage is supplied, can be suppressed.

4 Claims, 13 Drawing Sheets

: G0H~GmH=21V, B01H~B0mH=-1V, B10H~B1mH=-1V
G0L~GmL=-1V, B01L~B0mL=0V, B10L~B1mL=0V

US 7,859,909 B2

NONVOLATILE SEMICONDUCTOR MEMORY DEVICE

RELATED APPLICATIONS

This application is a Continuation of U.S. application Ser. No. 12/216,489, filed Jul. 7, 2008 now U.S. Pat. No. 7,596,033, which is a Continuation of U.S. application Ser. No. 11/701,404, filed Feb. 2, 2007 now U.S. Pat. No. 7,411,834, which claims priority of Japanese Application No. 2006-027010, filed Feb. 3, 2006, the entire contents of each of which are hereby incorporated by reference.

BACKGROUND OF THE INVENTION

1. Field of the Invention

The present invention relates to a nonvolatile semiconductor memory device and, particularly to a configuration of a decoder and an associated circuit that select and drive a word line. Specifically, the present invention relates to a configuration of a highly-integrated decoder portion that operates stably even when a high voltage is applied.

2. Description of the Background Art

A flash memory is excellent in portability and impact-resistance, and has characteristics of being electrically and collectively erasable. Therefore, in recent years, demand for the flash memory has been rapidly increased as a file storage of small portable information equipment such as a portable personal computer and a digital still camera.

One example of an array configuration of such a flash memory is shown in Reference 1 (Japanese Patent Laying-Open No. 2003-141887). In the configuration shown in Reference 1, a plurality of blocks, each including sub-arrays each having memory cells arranged in rows and columns, are provided. In the sub-arrays of each block, word lines are provided for the memory cells aligned in a row direction. Sources and drains of the memory cells aligned in a column direction are connected in common by using diffusion layers, respectively.

Drain diffusion layer interconnection is coupled to a global bit (data) line through a first block selection transistor that responds to a first block selection signal. Source diffusion layer interconnection is connected to a common source line through a second block selection transistor that passes current in response to a second block selection signal. These global bit line and the common source line are provided in common for the plurality of blocks, and writing/reading of data with respect to memory cells is executed in a selected block. Through the use of the diffusion layers as the drain line and the source line, a contact between the memory cells and a global bit line or between the common source line and metal interconnection can be shared by a plurality of memory cells aligned in the column direction, which can reduce a layout area of the memory cells (only one contact is necessary for one memory cell column).

Moreover, in the configuration shown in Reference 1, a word line decoding circuit for driving a word line into a selected state is configured into a hierarchical structure of a block decoder, a gate decoder and a sub-decoder for high speed operation. The block decoder selects a block and also generates a voltage transmitted to the selected word line. The gate decoder selects an addressed word line in the selected block. The sub-decoder drives the addressed word line into the selected state in accordance with output signals (voltages) of these block decoder and gate decoder.

The sub-decoder is constructed by a complementary MOS (CMOS) inverter. Power supply voltages (source voltages) levels on high and low sides of each sub-decoder are set in accordance with the output signal of the block decoder, and the output signal of the gate decoder is supplied to gates of the transistors of the sub-decoder.

The sub-decoder includes a P-channel MOS transistor (insulation gate field effect transistor), and an N-channel MOS transistor. Thus, in the sub-decoder, a well region is divided into an N-well region in which the P-channel MOS transistor is arranged and a P-well region in which the N-channel MOS transistor is arranged.

The P-channel MOS transistor and the N-channel MOS transistor constructing one sub-decoder element are arranged in alignment along a word line extending direction. By connecting the drains of the P-channel and N-channel MOS transistors of constructing one sub-decoder element to a word line extending linearly, a interconnection layout is simplified, and the arrangement of the transistors constructing the sub-decoder elements is simplified, which reduces a layout area of the sub-decoders.

However, in the case where the sub-decoder element constructed by the CMOS inverter is used, the following problem arises with the miniaturization of the memory cells. As the memory cells are more and more miniaturized, a length in size of one block in the column direction (source diffusion layer and drain diffusion layer) becomes smaller. In the sub-decoder constructed by the CMOS inverter, a source potential of the transistor is common to a well potential, and a common source voltage is supplied to the NMOS transistors and another common source voltage is to the PMOS transistors. Accordingly, between the adjacent sub-decoder elements, a source region can be shared by the N-channel MOS transistors and the source region can be shared by the P-channel MOS transistors. Thus, the transistors of the same conductivity type of two sub-decoder elements can be arranged in a common active region. However, since drain regions are connected to different word lines between the adjacent sub-decoder elements, the active region needs to be divided for each two sub-decoder elements. Therefore, an isolation region needs to be provided between the adjacent active regions, which causes a problem that shrinking of the layout of the sub-decoder cannot follow the miniaturization of the memory cells.

In a flash memory, an example of a memory cell configuration utilizing an assist gate is disclosed in Reference 2 (Japanese Patent Laying-Open No. 2001-028428). In Reference 2, a memory array is divided into blocks, writing/erasure/reading of data of memory cells are performed on a block basis. A sub-decoder for driving a word line has a CMOS configuration, and drives a word line in accordance with a gate signal and a block selection signal. Accordingly, in Reference 2 also, the problem with the layout of the sub-decoders also arises.

As an approach for solving this problem, in Reference 3 (Japanese Patent Laying-Open No. 2003-141887), there is suggested a method in which the elements of a sub-decoder are all constructed by N-channel MOS transistors. In the case where these sub-decoder elements are formed of N-channel MOS transistors, the diffusion layer (active region) is not needed to be divided for each two MOS transistors, and a common active region can be provided for a larger number of MOS transistors. In addition, the element transistors are all N-channel MOS transistors, and the region for implementing well isolation is not necessary, which can reduce a layout area of the sub-decoder.

However, in the flash memory, the memory cell is formed of a stacked gate type transistor having a floating gate. When data is written in a memory cell (electrons are injected to the floating gate), it is required to apply a high voltage of 17 V, for example, to a word line through the N-channel MOS transistor. In this case, in consideration of threshold voltage loss at the N-channel MOS transistor, a voltage higher than the word line voltage, for example, about 20 V is necessary to a gate of the N-channel MOS transistor. Thus, a voltage higher than breakdown voltage of the MOS transistor is applied, which can cause element destruction. In addition, in the case where such a high voltage is generated utilizing a charger pump circuit, for example, the number of stages of the charger pump needs to be increased, and accordingly, an area of an internal power supply circuit for generating the high voltage is increased.

By utilizing a high breakdown voltage transistor having a thick gate insulating film for the MOS transistor, the problem of the element destruction can be solved. However, when a high voltage is applied, a parasite MOS in an isolation region is produced, and leakage current is generated through such parasitic MOS, which increases power consumption. Further, there arises a problem that dielectric breakdown of the isolation region can occur.

A configuration for preventing such leakage current through the parasitic MOS of the sub-decoder is disclosed in Reference 3 (Japanese Patent Laying-Open No. 2005-243211). In this configuration shown in Reference 3, in an NAND type flash memory, in the erasure operation mode in which a high voltage is applied to memory cell well region, a negative voltage for preventing leakage current is applied to the well region of an X decoder. In the erasure operation, a power supply voltage Vcc of 4.5 V, for example, is applied to a gate of a high voltage transistor of the X decoder of a selected block. Also, a voltage lower than the power supply voltage by a threshold voltage of the high voltage transistor is applied to a gate of a transistor that selects a memory cell string to maintain the transistor in an off state, so that a ground line (source line) and a string line (drain) of the selected memory cell block are set into an electrically floating state. A well potential of the memory cell array is set to a high voltage of about 20 V in the erasure. In a non-selected memory block, the ground voltage is applied to the gate of the high voltage transistor, and similarly, the well potential is also set to a negative voltage to maintain the word line, the string line, and the ground line in the electrically floating state. This reduces leakage current by the high voltage transistor of the X decoder in the non-selected memory cell block. That is, in the non-selected memory block, by maintaining the word line in the electrically floating state, the non-selected memory cell is prevented from being subjected to erasure disturbance by the array well voltage due to a decrease in the word line voltage resulting from the leakage current in the high voltage transistor of the X decoder.

Further, a configuration in which leakage current between transfer gate transistors that transmit a word line driving voltage in X decoders is suppressed is disclosed in Reference 4 (Japanese Patent Laying-Open No. 2004-185660). In this configuration disclosed in Reference 4, the arrangement of the transfer gate transistors that transmit a high voltage is devised to avoid the occurrence of a state where the transfer gate transistors, to which a ground voltage, a program voltage and a pass voltage are applied respectively, are arranged adjacently. Thus, a parasitic MOS transistor, to which an on-voltage higher than the ground voltage, the pass voltage and the program voltage is applied, is prevented from being formed between the adjacent transfer gates, thereby suppressing the generation of channel leakage in this element isolation insulating film.

In Reference 1, by equalizing the lower source voltage of two transistor source potentials of the N-channel type transistors to the well potential, the N-channel MOS transistors of the sub-decoder elements are formed in a common active region to suppress the provision of the element isolation region, which reduces a chip area and achieves a high-speed operation.

However, in the configuration shown in Reference 1, since high voltage is used in the writing, leakage current through a parasitic MOS is also generated in the sub-decoder, so that current consumption is increased, and memory characteristics are deteriorated. Accordingly, in the case where distances between an isolation region end and an isolation region end, and between the isolation region and a gate electrode end are increased in order to suppress the leakage current through the parasitic MOS, the layout area of the sub-decoder is increased, which makes the miniaturization difficult. In Reference 1, the layout of the sub-decoder following the cell miniaturization is not considered.

In the configuration shown in Reference 2, the cell isolating insulation film region is eliminated through the use of an assist gate. However, in Reference 2, the CMOS inverter is utilized for the sub-decoder element, and the reduction in layout area of the sub-decoder is not considered. In addition, although a hierarchical structure is used for the decoder configuration, a common source signal is supplied to the sub-decoder elements in a memory block, and a word line is selected by a gate signal. In the decoder configuration in which the source signal is applied to individual sub-decoder elements, no consideration is given to the problem of the parasitic MOS due to high voltage.

In the configuration shown in Reference 3, the well potential of the X decoder is changed in the erasure, to maintain the word lines of the non-selected block in the electrically floating state, thereby avoiding the problem that leakage current is generated in the high voltage transistor of the X decoder. However, in the configuration shown in Reference 3, the well potential is adjusted in common to the X decoders in all blocks. Accordingly, load on a well potential generating unit becomes large, which makes it difficult to change the well potential at high speed. In addition, in Reference 3, leakage current for the non-selected word line is considered, but leakage current through the parasitic MOS by high voltage in the isolation region between the sub-decoder elements, and breakdown voltage of the isolation region are not considered.

In the configuration disclosed in Reference 3, the configuration of the transfer gate type decoder using a high voltage transistor is merely considered, and no consideration is given to a decoder configuration having a word line driver such as a CMOS inverter.

Reference 4 considers an issue of the X decoder of the NAND type flash memory, and particularly, intends to avoid the occurrence of leakage current through the parasitic MOS between the adjacent transfer gates. The arrangement of the transfer gates of the decoder is adjusted such that even if a parasitic MOS is formed, such voltages are applied to the parasitic MOS as to reduce the leakage current by a back-gate bias effect at the parasitic MOS. In addition, a voltage of a selected gate that transmits a pass voltage is made lower than a programming high voltage, so that even when the pass voltage and the ground voltage are applied to the drain and the source of the parasitic MOS, respectively, element dielectric breakdown characteristics is maintained.

However, in Reference 4, similarly to Reference 3, no consideration is given to the decoder configuration having a word line driver unit such as a CMOS inverter. In addition, no consideration is given to the problem of deterioration in isolation characteristics depending on a distance between a gate electrode of the transfer gate and a distance of an isolation region. Further, no consideration is given to dielectric breakdown characteristics between an active region end and the gate electrode in the transfer gate itself Furthermore, the miniaturization of the sub-decoder element is not considered.

SUMMARY OF THE INVENTION

It is an object of the present invention to provide a nonvolatile semiconductor memory device including an X decoder capable of miniaturizing transistors of sub-decoder elements without increasing parasitic MOS leakage current.

It is another object of the present invention to provide a nonvolatile semiconductor memory device including a sub-decoder circuit having elements miniaturized following the miniaturization of cells without deteriorating dielectric breakdown characteristics.

A nonvolatile semiconductor memory device according to the invention includes a memory cell array having a plurality of memory cells arranged in rows and columns, a plurality of word lines arranged corresponding to memory cell rows, and having memory cells on corresponding rows connected thereto, a sub-decoding circuit including sub-decoding elements arranged corresponding to the word lines, and setting voltages of the word lines in accordance with a pair of source signals and a pair of gate signals, a block decoding circuit for generating the source signals in accordance with an address signal, and a gate decoding circuit for generating the gate signals in accordance with the address signal. The sub-decoding element includes first and second transistors of the same conductivity type each having a gate, a source and a drain. The first and second gate signals from the gate decoding circuit are supplied to the gates of the first and second transistors, respectively, the first and second source signals from the block decoding circuit are supplied to the sources of the first and second transistors, respectively, and the drains of the first and second transistors are coupled to a corresponding word line in common.

The nonvolatile semiconductor memory device according to the invention further includes a substrate potential setting circuit for setting a potential of a substrate region, in which the sub-decoding circuit is formed, separately from the source signals of the first and second transistors.

By setting the potential of the substrate region of the sub-decoding elements separately from the source potential, leakage in isolations through a parasitic MOS can be improved by a back gate effect. The adjustment of only the well voltage is necessary, and well impurity concentration under the isolation region is not required to be high, so that deterioration in breakdown characteristics of PN junction of the transistors can be avoided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
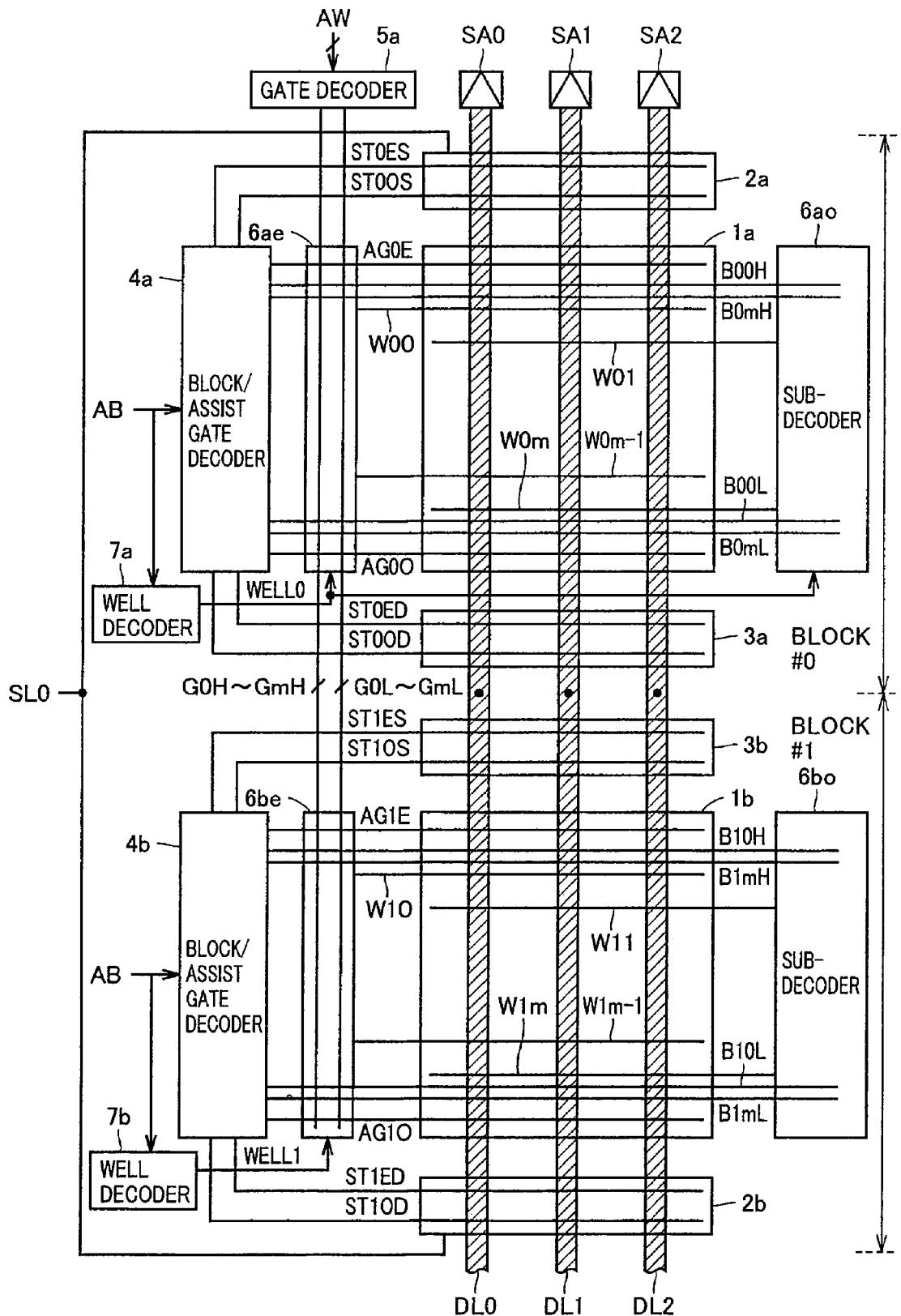
FIG. 1 is a diagram schematically showing an entire configuration of a nonvolatile semiconductor memory device according to the invention.

FIG. 1 is a diagram schematically showing a configuration of a main part of a nonvolatile semiconductor memory device according to First Embodiment of the invention. In FIG. 1, two memory blocks #0 and #1 are shown representatively. The number of blocks can be any, and more blocks may be provided. Memory block #0 includes a memory sub-array 1a having memory cells (not shown) are arranged in rows and columns. In memory sub-array 1a, word lines W00-W0m are provided corresponding to the memory cell rows, and in a direction perpendicularly crossing the word lines, local source lines and local bit lines each formed of a diffusion layer described later are arranged.

Memory block #0 further includes a block/assist gate decoder 4a that sets memory sub-array 1a into a selected state in accordance with a block address signal and a word line address signal AB, generates a voltage transmitted to a selected word line in the memory sub-array 1a, and further generates a signal to activate an assist gate, a gate decoder 5a that generates gate signals G0H to GmH and G0L to GmL for selecting a word line (group) in accordance with a word line address signal AW in common to memory blocks #0 and #1, and sub-decoders 6ae and 6ao that set a voltage level of the word lines in accordance with the output signals of this gate decoder 5a and the output signals of block assist gate decoder 4a.

Sub-decoders 6ae and 6ao are arranged in opposite sides of memory sub-array 1a in a word line extending direction, and sub-decoder 6ae drives even-numbered word lines W00, . . . W0m−1, while sub-decoder 6ao drives odd-numbered word lines W01, . . . , W0m, with m being an odd number. The arrangement of sub-decoders 6ae and 6ao on opposite sides of memory sub-array 1a mitigates a pitch condition in a column direction (in a bit line direction) of the sub-decoder elements arranged corresponding to the word lines in the sub-decoders.

When memory block #0 is selected, block/assist gate decoder 4a performs decoding operation for selectively activating assist gate signals AG0E and AG0O, and in addition, generates high-side source signals B00H to B0mH and low-side source signals B00L to B0mL.

The memory cell has an assist gate, and a channel is selectively formed under the assist gate in accordance with the assist gate signals AG0E and AG0O. The assist gates are described in detail later.

Sub-decoders 6ae and 6ao transmit a selection voltage or a non-selection voltage to the word lines in accordance with the combination of the gate signals of from gate decoder 5a and the source signals of from block/assist gate decoder 4a. High-side source signals B00H to B0mH are signals for supplying a positive or negative high voltage to a selected word line, and low-side source signals B00L to B0mL are signals for supplying a low voltage to non-selected word lines.

For memory block #0, a well decoder (substrate potential setting circuit) 7a is further provided for setting a well potential WELL0 of the sub-decoder elements included in the sub-decoders 6ae and 6ao in accordance with the block address signal. According to the well potential WELL0 produced from well decoder 7a, the well potential of the sub-decoder 6ae and 6ao is adjusted. When the sub-decoder element is constructed by an NMOS transistor, the well potential is set to a voltage level lower than its source potential to suppress the generation of a parasitic MOS owing to a back gate effect.

In memory block #0, there are further provided a source-side block selecting circuit 2a that couples local source lines of memory sub-array 1a to global bit lines DL0, DL1 and DL2 in accordance with source-side block selection signals ST0ES and ST0OS from block/assist gate decoder 4a, and a drain-side block selecting circuit 3a that couples the local bit lines (drain lines) of memory sub-array 1a to global bit lines DL0 to DL2 in accordance with drain-side block selection signals ST0ED and ST0OD from block/assist gate decoder 4a.

Also in memory block #1, as a substrate potential setting circuit, a well decoder 7b is provided, which sets a well potential of sub-decoders 6be and 6bo to a voltage level lower than the source potential in accordance with an operation mode (in the case where the sub-decoder elements are constructed by NMOS transistors).

Global bit lines DL0, DL1 and DL2 are formed of metal interconnection lines extending in the column direction in common to memory blocks #0 and #1, and the reading of data is performed by sense amplifiers SA0, SA1 and SA2 arranged at ends thereof.

In addition, a global source line SL0 formed of metal interconnection line is provided in common to these memory blocks #0 and #1. Global source line SL is coupled to source-side block selecting circuit 2a, and via source-side block selecting circuit 2a, is coupled to a local source line on a selected column of memory sub-array 1a.

Also for memory block #1, a configuration similar to that of memory block #0 is provided, that is, a memory sub-array 1b, a block/assist gate decoder 4b, a source-side block selecting circuit 2b, a drain-side block selecting circuit 3b, sub-decoders 6be and 6bo, and well decoder 7b are provided.

One of these memory blocks #0 and #1 is selected based on the block selection signal, and is coupled to common source line SL0 and global bit lines DL0 to DL2. Selection of the memory cells, and writing, erasure and reading of data are performed in the selected memory block. The non-selected memory block is maintained in a standby state.

Each of global bit lines DL0, DL1 and DL2 is provided for a set of two diffusion layers (source diffusion layer and drain diffusion layer), or a set of a local bit line and a local source line. Accordingly, one global bit line merely is arranged for each two local bit lines, so that interconnection pitch of the global bit lines can be alleviated twice as much as a case where a global bit line is provided corresponding to each bit line, which can cope with the miniaturization of the memory cells.

Figure 2:
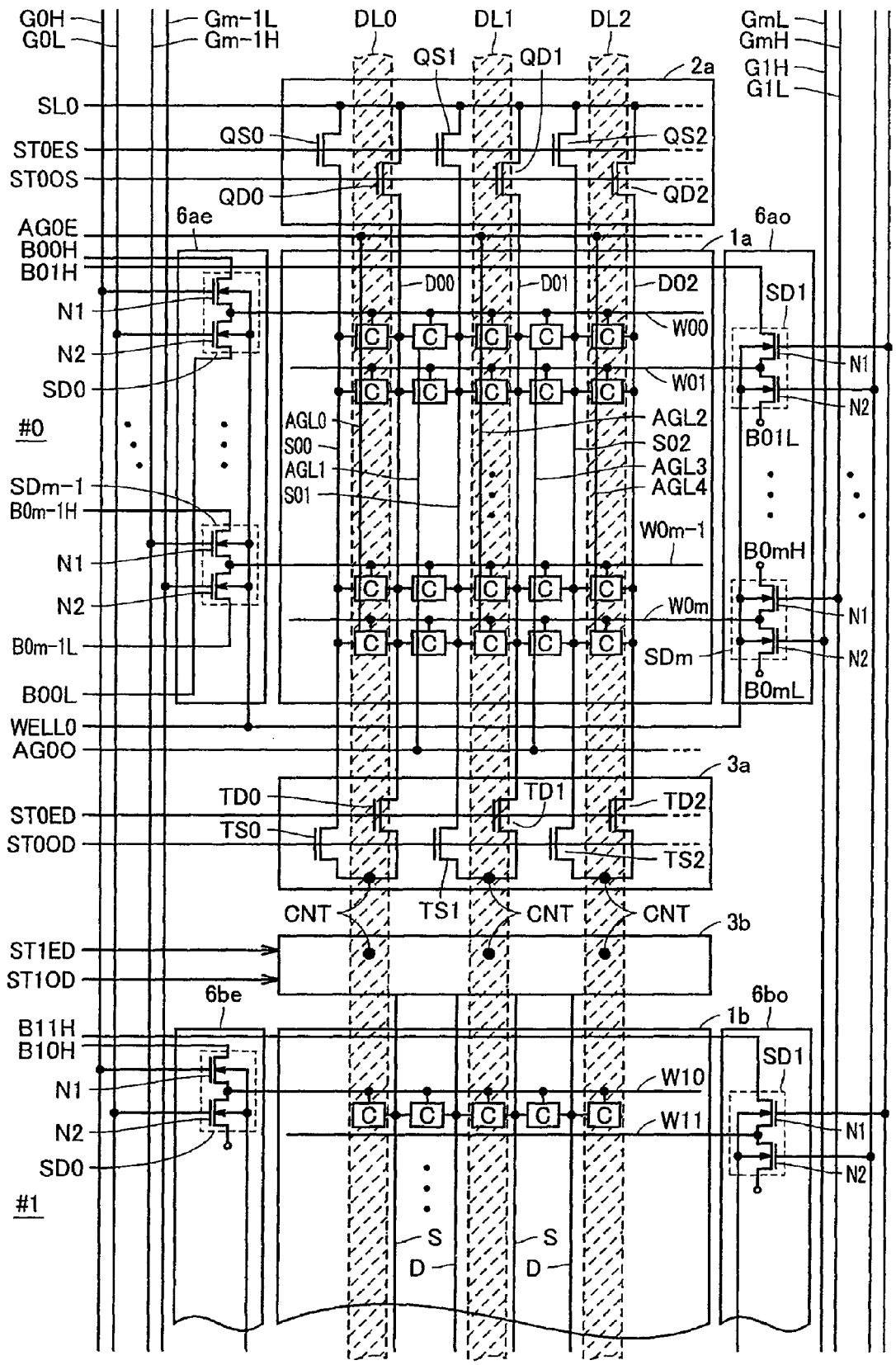
FIG. 2 is a diagram more specifically showing the configuration of one memory block of the nonvolatile semiconductor memory device as shown in FIG. 1.

FIG. 2 is a diagram showing the configuration of a main portion of the nonvolatile semiconductor memory device as shown in FIG. 1 in greater detail. In FIG. 2, the configuration of sub-decoders 6ae and 6ao of memory block #0, memory sub-array 1a, and block selecting circuits 2a and 3a is shown, and the configuration of memory block #1 is partially shown, because it is similar except for the control signals applied.

In FIG. 2, memory cells C are arranged in rows and columns in memory sub-array 1a. Word lines W00 to W0m are provided corresponding to the respective rows of memory cells C. In memory cell columns, two types of diffusion layer interconnections S00 to S02 and D00-D02 are provided alternately so as to be shared between the memory cells in an adjacent columns. Since the diffusion layer interconnection is shared by the adjacent memory cell columns, the memory cells have a so-called virtually grounded memory cell structure, and which of interconnections S00 to S02 and D00 to D02 is used as the local source lines and as local bit lines is set according to the position of the selected memory cells appropriately. Here, for convenience in the drawings, the diffusion layers indicated by reference characters S00 to S02 are referred to as the source diffusion layers, and the diffusion layers indicated by reference characters D00 to D02 are referred to as the drain diffusion layers.

Assist gate lines AGL0 to AGL4 are provided corresponding to the respective memory cell columns. An assist gate signal AG0E is supplied to assist gate lines AGL0, AGL2 and AGL4, and an assist gate signal AG0O is supplied to assist gate lines AGL1 and AGL3. These assist gate lines AGL0 to AGL4 each form a channel in a semiconductor substrate region surface therebelow when selected.

Source-side block selecting circuit 2a includes block selecting transistors QS0 to QS2 provided corresponding to the respective source diffusion layer interconnections S00 to S02, made conductive in response to block selection signal ST0ES, and connecting corresponding source diffusion layer interconnections S00 to S02 to common source line SL0 when made conductive, and block selecting transistors QD0 to QD2 provided for respective diffusion layer interconnections D00 to D02, selectively made conductive in accordance with source block selection signal ST0OS, and connecting corresponding drain diffusion layer interconnections D00 to D02 to common source line SL0 when made conductive.

Drain-side block selecting circuit 3a includes drain-side block selecting transistors TD0 to TD2 provided corresponding to respective drain diffusion layer interconnections DO0 to D02, selectively made conductive in response to drain-side block selection signal ST0ED, and coupling corresponding drain interconnections D00 to D02 to global bit lines DL0 to DL2 through contacts CNT when made conductive, and block selecting transistors TS0 to TS2 provided for respective source interconnections S00 to S02, selectively made conductive in accordance with drain-side block selection signal ST0OD, and coupling corresponding source interconnections S00 to S02 to global bit lines DL0 to DL2 through contacts CNT when made conductive.

When memory block #0 is selected, the diffusion layer interconnections connected to common source line SL0 serve as the local source lines, and the diffusion layer interconnections connected to global bit lines DL0 to DL2 serve as the local bit lines.

Sub-decoder 6ae includes sub-decoder elements SD0 ... SDm−1 provided for respective even-numbered word lines W00, ... W0m−1, and sub-decoder 6ao includes sub-decoder elements SD1, ... SDm provided corresponding to respective odd-numbered word lines W01, ... W0m.

Each of sub-decoder elements SD0 to SDm includes two N-channel MOS transistors N1 and N2. MOS transistors N1 and N2 are each formed of a single-gate high-voltage transistor having a thick insulation film, which assures breakdown-resistance (breakdown voltage characteristics) when a high voltage is applied. MOS transistors N1 and N2 have control gates, by way of example, formed in the same process steps as manufacturing process steps of the control gate of the memory cell, and have the gate insulation film made thick.

In a sub-decoder element SDi (i=0 to m), a high-side source signal B0iH is supplied to a source side of first N-channel MOS transistor N1, and a low-side source signal B0iL is supplied to a source side of second N-channel MOS transistor N2. Drain nodes of first and second N-channel MOS transistors are coupled together to a corresponding word line W0i. Gates of first and second N-channel MOS transistors N1 and N2 are supplied with a high-side gate signal GiH and a low-side gate signal GiL, respectively.

In the N-channel MOS transistors, normally, out of two impurity regions (nodes), an impurity region (node) supplied with a higher voltage acts as a drain, and an impurity region (node) supplied with a lower voltage acts as a source. However, here, an impurity region supplied with the source signal is referred to as a source.

Gate signals GiH and GiL are signals for selecting a word line in the memory sub-array, and are generated in accordance with the word line address signal (AW) applied from an address buffer.

As described above, high-side source signal B0iH is a source signal for supplying a positive or negative high potential to a word line, and low-side source signal B0iL is a signal for supplying a low potential to a word line.

Also, in memory block #1, a configuration similar to that of this memory block #0 is provided. In FIG. 2, in memory block #1, block selection signals ST1ED and ST1OD supplied to drain-side block selecting circuit 3b, and high-side source signals B11H and B10H are shown representatively. These high-side source signals B10H and B11H are supplied to sources of first N-channel MOS transistors N1 of sub-decoder elements SD0 and SD1 included in sub-decoders 6be and 6bo, respectively.

According to the output signals of block/assist gate decoders 4b (refer to FIG. 1), the selection of the block and the selective connection between the local bit lines and the local source lines, and selective connection between the global bit lines and the common source line are performed.

Figure 3:
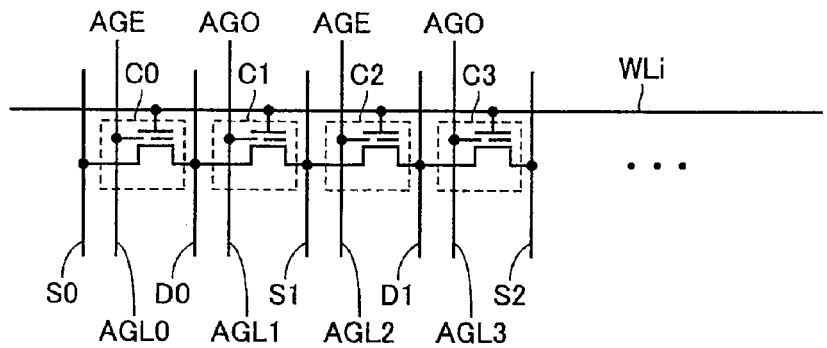
FIG. 3 is a diagram showing an electrical equivalent circuit of memory cells in a memory sub-array as shown in FIG. 2.

FIG. 3 is a diagram showing an electrical equivalent circuit of the memory cells. The configuration of the memory cells in memory blocks #0 and #1 is the same, and in FIG. 3, a word line WLi is shown, which is used here to correspond to word line W0i or W1i included in memory blocks #0 or #1.

Control gates of the memory cells in one row are connected to word line WLi. In FIG. 3, four memory cells C0-C3 are shown representatively. Memory cell C0 is connected between a source line (source diffusion layer interconnection) 50 and a drain line (drain diffusion layer interconnection) D0, memory cell C1 is connected between drain line D0 and a source line S1, and memory cell C2 is connected between source line S1 and a drain line D1. Memory cell C3 is connected between drain line D1 and a source line S2. The interconnection between the memory cells is shared between the memory cells adjacent in the row direction (word line extending direction).

Assist gate lines AGL0 to AGL3 are provided corresponding to memory cells C0 to C3, respectively to supply assist gate signals AGE and AGO alternately. Accordingly, memory cells C0 to C3 are each equivalent to a series connection configuration of stacked gate transistor having a floating gate, and source/drain diffusion (impurity) regions, and a single gate MOS transistor having an assist gate line as a control electrode.

Figure 4:
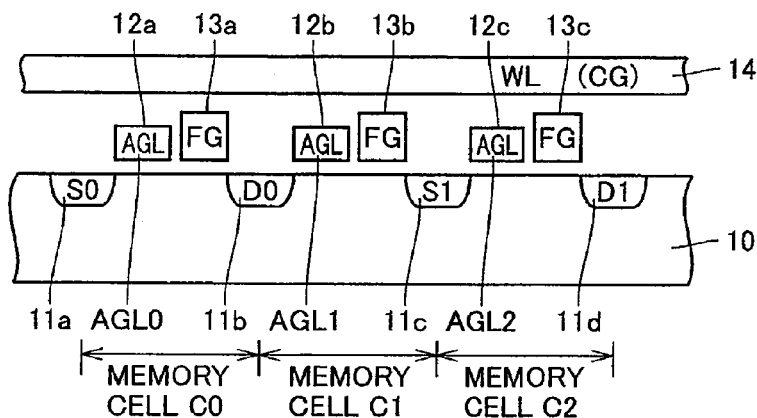
FIG. 4 is a diagram schematically showing a cross-sectional structure of the memory cells shown in FIG. 3.

FIG. 4 is a diagram schematically showing an example of a cross-sectional structure along the word line WL direction of memory cells C0 to C2 shown in FIG. 3. In FIG. 4, on a surface of a semiconductor substrate region (well region) 10, diffusion layers 11a, 11b, 11c and 11d are formed apart from each other. Diffusion layers 11a to 11d function as alternately arranged source diffusion layer interconnection S (50, S1) and drain diffusion layer interconnection D (D0, D1).

Between the adjacent diffusion layers, there are a conductive line constructing assist gate line AGL and a conductive layer constructing a floating gate FG. In FIG. 4, a conductive line 12a constructing assist gate line AGL0 and a conductive layer 13a constructing floating gate FG are provided between diffusion layers 11a and 11b, a conductive line 12b forming assist gate line AGL1 and a conductive layer 13b forming floating gate FG are provided between diffusion layers 11b and 11c. A conductive line 12c forming assist gate line AGL2 and a conductive layer 13c forming floating gate FG are provided between diffusion layers 11c and 11d.

Diffusion layers 11a to 11c and conductive lines 12a to 12c forming assist gate lines AGL are provided continuously extending in the column direction in one memory block. The conductive layers forming floating gates FG are arranged only in the region of a memory cell. In a layer above conductive lines 12a to 12c and conductive layers 13a to 13c, conductive interconnection 14 constructing word line WL is provided. This conductive layer 14 constructing word line WL forms a control gate (CG) at an crossing with floating gate FG of each memory cell.

In the construction where semiconductor substrate region 10 is a P-type semiconductor substrate region, and diffusion layers 11a to 11d are N-type diffusion layers, when a positive voltage is applied to assist gate line AGL (conductive lines 12a to 12c), a channel is formed in the substrate region surface immediately under the assist gate line. In this state, a path for passing current between drain diffusion layer D and source diffusion layer S is formed in a memory cell depending on an amount of accumulated charges in floating gate FG. When assist gate line AGL is set to a level lower than the ground voltage, for example, the channel is not formed thereunder, and the current flowing path is not formed. This prevents data contention between adjacent memory cells even when the drain region or source region is shared between adjacent memory cells.

The assist-gate type memory cell structure as shown in FIG. 4 is merely an example, and another assist-gate type memory cell structure may be used.

Now, referring to FIGS. 2 to 5, the operations of the memory cells are described.

(1) Writing Operation

Figure 5:
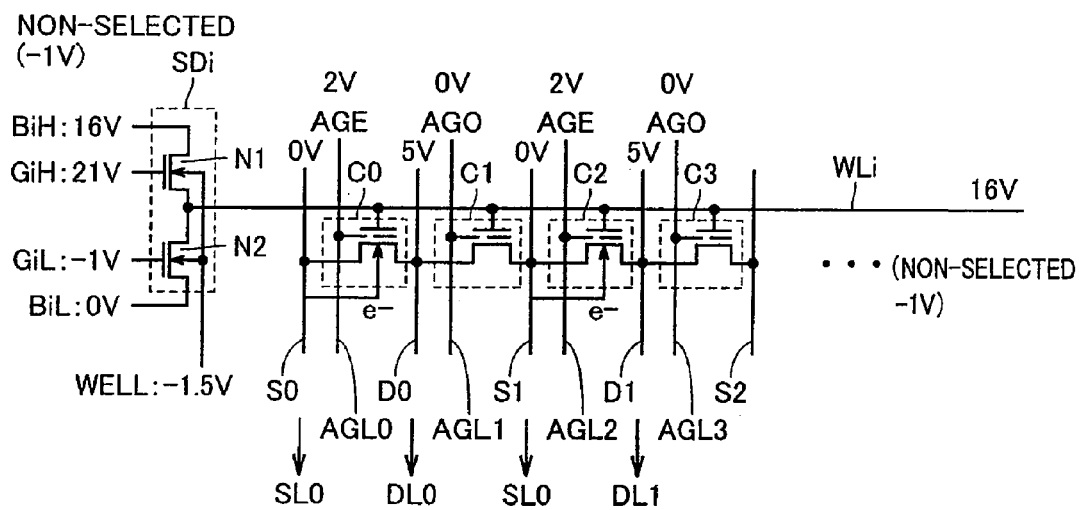
FIG. 5 is a diagram showing applied voltages at the writing operation time of the memory cells shown in FIG. 3.

Writing is performed by injecting hot electrons into the floating gate (FG). FIG. 5 shows applied voltages in the case where writing to memory cells C0 and C2 is performed in the arrangement of the memory cells as shown in FIG. 3.

In FIG. 5, in a sub-decoder element SDi corresponding to selected word line WLi, a high-side source signal BiH is set to 16 V, and a low-side source signal BiL is set to the ground voltage (0 V). High-side gate signal GiH is set to 21 V, and low-side gate signal GiL is set to −1 V. Although high-side gate signal GiH is set to 21 V, it is set to a voltage level allowing transmission of 16 V to the selected word line in consideration of threshold voltages of high voltage transistors N1, N2. Accordingly, high-side gate signal GiH may be 20 V.

A well potential WELL is set to a voltage level lower than the low-side source potential, and in this case, set to −1.5 V. Since if well potential WELL is at the voltage level lower than the source signal of the low potential, the effect of suppressing a parasitic MOS is brought about, well potential WEll is set to an appropriate value in consideration of operation speed and current driving power and others of transistors N1, N2 in the sub-decoder element. In addition, assist gate signal AGE is set to 2 V, and assist gate signal AGO is set to the ground potential (0 V). Further, the selection signal to the block selecting circuit is set to 10 V in a selected state and is set to the ground voltage 0 V in a non-selected state.

High-side source signal BiH is transmitted via first MOS transistor N1 of sub-decoder element SDi, and the voltage level of selected word line WLi attains 16 V.

5 V is transmitted to global bit lines DL0 to DL2, and 0 V is set for common source line SL0. Block selecting circuits 2 (2a, 2b) and 3 (3a, 3b) establishes selective connection between the global bit lines and local bit lines, and between the common source line and the local source lines (block selection signals STED, STES are set to 10 V in the selected state, and to 0 V in the non-selected state), and 0 V is transmitted to source diffusion layer interconnection S0 and S1 for the selected memory cells and 5 V is transmitted to drain diffusion layer interconnection D0 and D1.

In this state, in memory cells C0 and C2, channels are formed under assist gate lines AGL0 and AGL2, and the current flowing paths between the source diffusion layer interconnection and the drain diffusion layer interconnection are formed. Thereby, in memory cells C0 and C2, electrons e-flowing from the source side turn into hot electrons by a drain high electric field, and are accelerated by an electric field generated by the high voltage on word line WLi to be injected into the floating gates. On the other hand, in memory cells C1 and C3, no inversion layer is formed under assist gate lines AGL1 and AGL3, and the current flowing paths are not formed. Accordingly, in memory cells C1 and C3, the channel current does not flow, and accordingly, no hot electrons are generated, so that writing is not performed.

When word line WLi is in the non-selected state, high-side source signal BiH is set to −1 V, and accordingly, the word line WLi is maintained at −1 V by first N-channel MOS transistor N1. The second MOS transistor is maintained in an off state regardless of selection/non-selection of the corresponding word line. The reason why the non-selected word line is set to a negative voltage state of −1 V is as follows. In the memory cell in a non-selected row and a selected column, a channel is formed by the assist gate line, and a voltage difference of 5 V between the drain diffusion layer and the source diffusion layer is developed. In this state, the non-selected word line voltage prevents a channel from being formed under the floating gate regardless of an amount of accumulated charges in the floating gate, and accordingly, prevents a channel current from flowing, to prevent miswriting from occurring.

In addition, by setting well potential WELL to −1.5 V at a voltage level lower than the source voltage −1.0 V of the lower potential, the formation of a parasitic MOS under an isolation region between the sub-decoder elements (field insulation film) is suppressed, which can prevent leakage current from flowing, and suppress leakage in isolations. While in this case, well voltage WELL is set to −1.5 V, it may be set to a voltage level of −2.0 V to −2.5 V, which is a voltage level lower by 1 V than the source potential. This can more effectively suppress the parasitic MOS. This well voltage is set to an appropriate voltage level in view of balance between the threshold voltage of the transistors and the suppressing effect of the parasitic MOS.

Further, in the case where memory block #0 is in the selected state and the memory block #1 is in the non-selected state in FIG. 2, block selecting circuit 3b is in a non-conductive state, and the source diffusion interconnections and the drain diffusion interconnections are all maintained in a floating state. Furthermore, in the non-selected memory block, high-side source signal B1iH is −1 V and all the word lines are maintained at −1 V of the non-selected state (the gate signals are supplied to memory blocks #0 and #1 in common).

In this case, the well voltage in the non-selected memory block is set to the same voltage level as the source voltage of the lower potential (−1 V), or lower, for example, −1.5 V. In this case, in the non-selected memory block since the high voltage is not applied, the well potential may also be at the same voltage level as that of the source potential of the low potential of the sub-decoder circuit.

In FIG. 5, voltage levels of the source signals and the gate signals when memory cells C00, C02 are selected in memory block #0 are shown. Source signals B00H and B00L to selected memory cells C00 and C02 are 16 V and 0 V, respectively.

In the sub-decoder circuit, by setting the well potential independently of the source potential on a block basis, the well potential can be set to the voltage level lower than the source potential of the low potential, and in the selected memory block, the generation of the parasitic MOS under the isolation region can be suppressed. In the non-selected memory block, since the high voltage is not applied, the parasitic MOS is not generated even when the well potential is set to the same voltage level as that of the source potential of the sub-decoder element, thereby causing no problem. However, by putting the well potential into a deeply biased state, second MOS transistor N2 can reliably be set to an off state, which can reliably suppress the leakage current in the second MOST transistor (current consumption in a circuit generating the source negative voltage can be reduced).

As described above, by setting the voltage of assist gate line AGL to an appropriate voltage level, a current amount flowing in the writing can be suppressed, which can achieve parallel operation corresponding to writing operation utilizing an FN tunnel phenomenon. Accordingly, the assist gate (a portion of the assist gate line corresponding to one memory cell) plays a role of electrically isolating adjacent memory cells connected to the same word line in the writing, and fulfills a function of suppressing the current flowing amount in the writing.

(2) Erasure Operation

Figure 6:
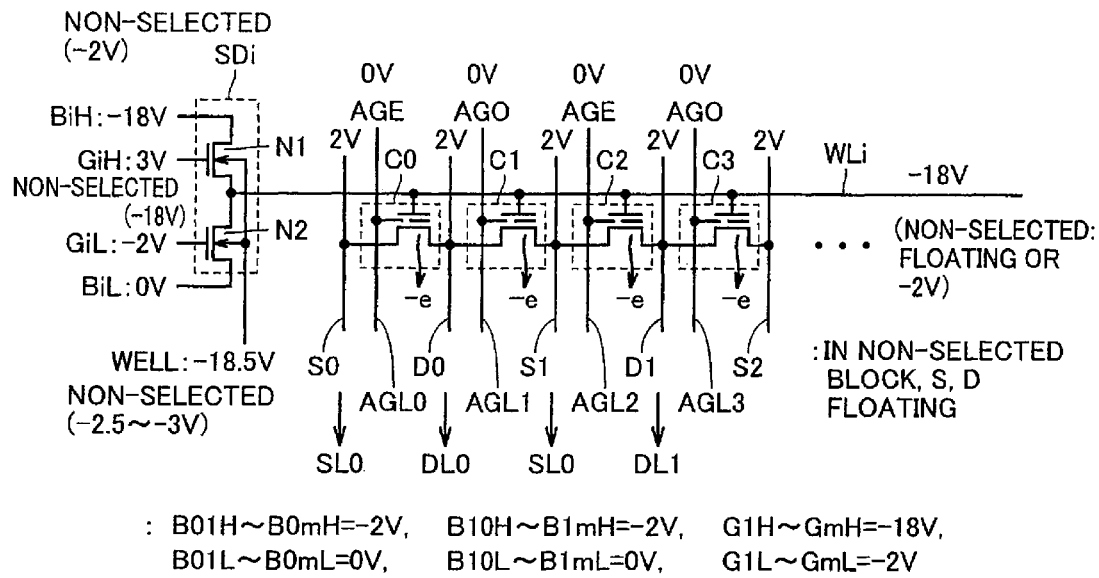
FIG. 6 is a diagram showing applied voltages in the erasure operation with respect to the memory cells shown in FIG. 3.

In the erasure operation, the erasure is performed on a word line basis by ejecting electrons from the floating gate to the substrate by utilizing the FN tunnel current. In FIG. 6, applied voltages in the erasure operation are shown.

In the erasure operation, as shown in FIG. 6, in sub-decoder element SDi for selected word line WLi, high-side source signal BiH is set to −18 V, low-side source signal BiL is set to the ground voltage (0 V); High-side gate signal GiH is set to 3 V, and low-side gate signal GiL is set to −2 V. Common source line SL0 is set to 2 V, and according to block selection signal STES or STOS of 10 V level of the selected state, source diffusion layer interconnections S0 and S1 are set to 2 V in accordance with the voltage of common source line SL0 though the source-side block selecting circuit.

Global bit lines DL0 to DL2 are also set to 2 V, and according to the signal of the selected state (10 V) out of the block selection signals to the drain-side block selecting circuit, drain diffusion layer interconnections D0 and D1 are also set to 2 V in accordance with the voltage level of these global bit lines DL0 to DL2. All of assist gate signals AGE and AGO are at the ground voltage (0 V). At this time, well potential WELL is set to a voltage level lower than the source signal of the low potential, for example, −18.5 V.

In this state, first MOS transistor N1 turns conductive to set the selected word line WLi to −18 V. Second MOS transistor N2 is in an off state. All of assist gate lines AGL0 to AGL3 do not have the channels formed thereunder, so that the current flowing paths are shut off in memory cells C0 to C3.

The well voltage of the memory cell array is set to the ground voltage or a positive voltage level. Accordingly, in memory cells C0 to C3, electrons are ejected from the floating gates to the well region in the form of FN tunnel current.

When word line WLi is non-selected, high-side gate signal GiH is set to −18 V, high-side source signal BiH is set to −2 V, and first MOS transistor N1 is maintained in an off state. Low-side gate signal GiL is −2 V, and second MOS transistor N2 enters an off state, so that the non-selected word line is maintained in an electrically floating state.

As shown in FIG. 6, in the non-selected memory block, the source diffusion layer interconnections and the drain diffusion layer interconnections are in a floating state with the block selecting circuits being in the non-conductive state, and the assist gate lines are all maintained at the ground voltage level. In addition, high-side source signal BiH for a non-selected word line is −2 V, and low-side source signal BiL is the ground voltage. High-side gate signal GiH for the non-selected word line is set to −18 V. Accordingly, the non-selected word line is set into the electrically floating state, and the erasure of memory cells are prevented from being performed in a non-selected row.

FIG. 6 shows the voltage levels of source signals B0iH, B0iL, B1iH, B1iL, and gate signals G0H, GmH, G0L, GmL for the non-selected word line in the case where the selected word line is word line W00.

In the erasure, well voltage WELL of the sub-decoder elements of a selected memory block is also set to a voltage level lower than the source signal of the low potential, for example −18.5 V, which prevents PN junction of transistors N1, N2 from being set into a forward-biased state.

When well voltage WELL is at a voltage level of the source of the low potential (−18 V) or lower, PN junction between the source/drain regions and the well region can be sufficiently prevented from entering the forward bias state, and therefore, well voltage WELL may be set to the same potential as the source potential of the low potential. As in writing operation, well voltage WELL is set to an appropriate value in view of balance between the operation speed of the MOS transistors and the back gate effect. In the non-selected memory block, the low potential of the source signal is −2 V, and therefore, well voltage WELL may be a voltage lower than this voltage, or −2 V of the same voltage level, or may be set to, for example, −2.5 V.

(3) Reading Operation

Figure 7:
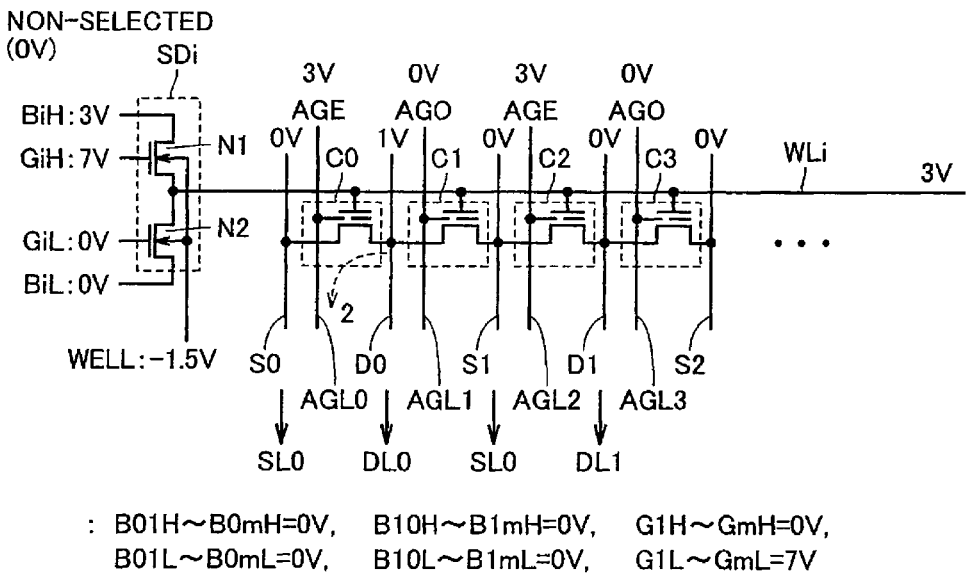
FIG. 7 is a diagram showing applied voltages when the reading operation is performed with respect to the memory cells shown in FIG. 3.

FIG. 7 shows applied voltages in the case where data of memory cell C0 is read. In this case, high-side source signal BiH for sub-decoder element SDi is set to 3 V, and low-side source signal BiL is set to the ground voltage 0 V. High-side gate signal GiH is 7 V, and low-side gate signal GiL is 0 V. Assist gate signal AGE is set to 3 V, and assist gate signal AGO is set to the ground voltage (0 V). Common source line SL0 is set to the ground voltage (0 V), and source diffusion layer interconnections S0 and S1 are set to the ground voltage 0 V in accordance with the voltage level of common source line SL0 (block selection signals STES, STOS are 10 V in the selected state).

Global bit lines DL0, DL1 and DL2 are set to 1 V, 0 V and 0 V, respectively. According to the voltages of these global bit lines, drain diffusion layer interconnection D0 is set to 1 V, and drain diffusion layer interconnection D1 is set to the ground voltage 0 V (block selection signals STED, STOD on the drain side are also 10 V).

In this state, in sub-decoder element SDi, first MOS transistor N1 is in an on state, and second MOS transistor N2 is in an off state, and the selected word line WLi is set to 3 V by first MOS transistor N1.

In memory cells C0 and C2, the channel is formed by assist gate signal AGE. However, in memory cell C2, both the source and the drain are at the ground voltage level, so that no current flows and the reading of the data is not performed. On the other hand, in the memory cell C0, the voltage level of drain diffusion layer interconnection D0 is 1 V, and the voltage level of the source diffusion layer interconnection S0 is 0 V, so that between these interconnections, current flows in accordance with memory data, to read the data on the global bit line through the drain diffusion layer interconnection.

In the non-selected memory block, the block selecting circuits are in the non-selected state, and its source diffusion layer interconnection and its drain diffusion layer interconnection attain and are kept in the floating state.

When word line WLi is in the non-selected state, the ground voltage 0 V is applied as high-side source signal BiH. For a non-selected sub-decoder element, contrary to the selected sub-decoder-element, low-side gate signal GiL is set to 7 V, and high-side gate signal GiH is set to the ground voltage level of 0 V. Accordingly, one of gate signal GiL and GiH is set to 7 V, and the non-selected word line is maintained at the ground voltage level by first or second MOS transistor N1 or N2. In FIG. 7, voltage levels of the signals for each sub-decoder element are shown in the case where selected word line WLi is W00.

In the data reading, well voltage WELL only needs to be at a voltage level lower than the source signal of the low potential, and is set to a voltage level of −1.5 to −1.0 V. However, in the reading, since high voltage is not used, probability of the generation of the parasitic MOS is small, and therefore, the lower source voltage and the well voltage may also be at the same voltage level.

In the reading operation, the assist gate has a function of electrically separating the adjacent memory cells in a common word line, thereby precisely reading only data of one memory cell in the memory cells sharing the diffusion layer interconnection.

In FIG. 7, when drain diffusion layer interconnection D1 is also set to 1 V, the channel is formed under assist gate line AGL2 in memory cell C2. Accordingly, in memory cell C2, a path through which a current flows between diffusion layer interconnections S1 and D1 can also be formed and accordingly, data of memory cell C2 can be read.

Figure 8:
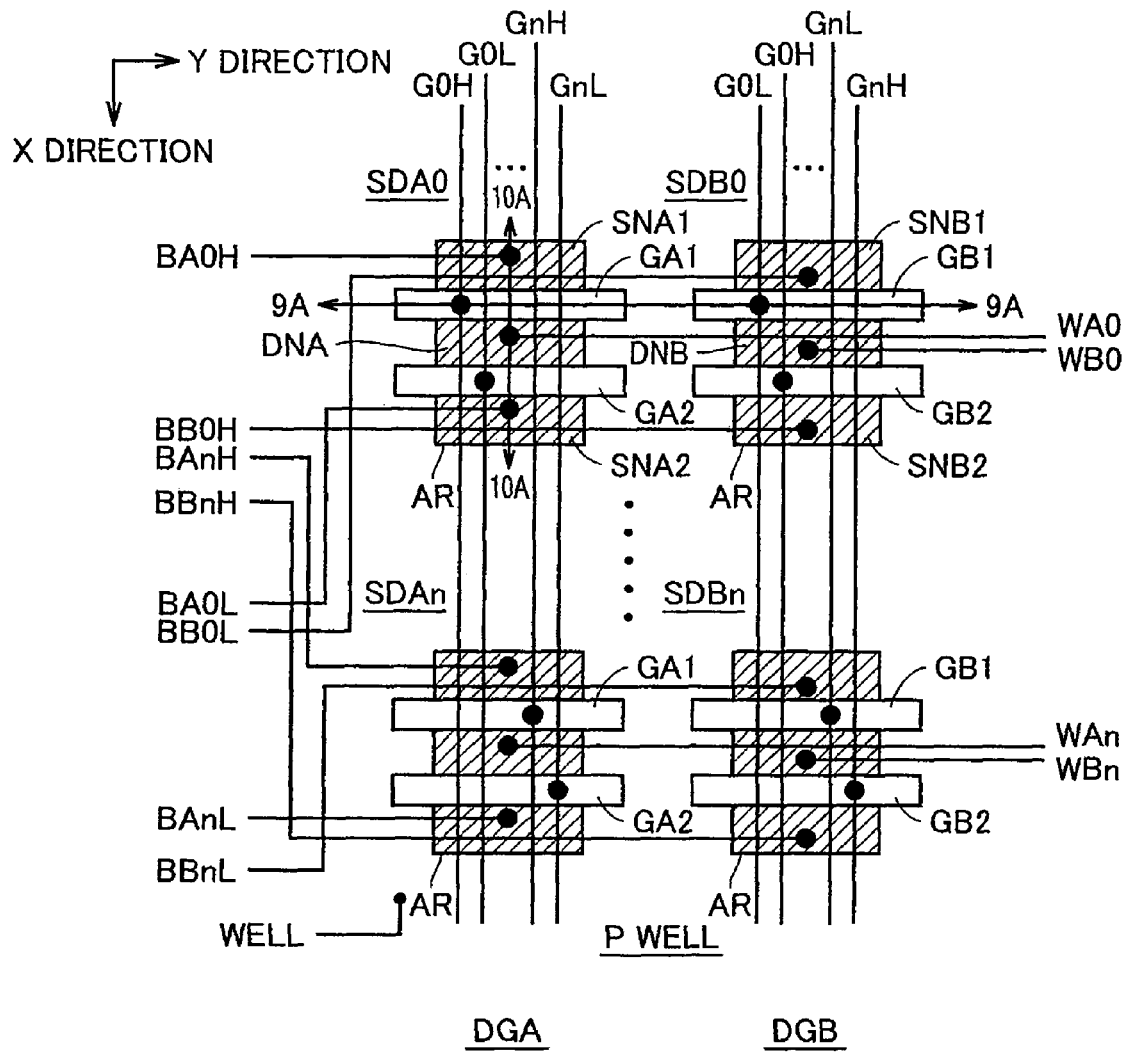
FIG. 8 is a diagram schematically showing a layout of sub-decoder elements of the sub-decoder circuit according to First Embodiment of the invention.

FIG. 8 is a diagram showing an example of a layout of the sub-decoder elements in the sub-decoder circuit. In FIG. 8, two columns of sub-decoder element groups DGA and DGB are provided. In sub-decoder element group DGA, sub-decoder elements SDA0 to SDAn are arranged in alignment along an X direction, and in sub-decoder element group DGB, sub-decoder elements SDB0 to SDBn are arranged in alignment along the X direction.

These sub-decoder elements SDA0 to SDA1n, and SDB0 to SDBn are formed in a P well that receives well voltage WELL.

Each of sub-decoder elements SDA0 to SDAn, SDB0 to SDBn is formed in an active region AR formed in the well region surface. Active region AR of sub-decoder element SDA0 includes source impurity regions (diffusion layers) SNA1 and SNA2 arranged on both sides and a drain impurity region DNA (diffusion layer) formed between impurity regions (diffusion layers) SNA1 and SNA2.

A gate electrode GA1 is arranged between impurity regions SNA1 and DNA, and a gate electrode GA2 is formed between impurity region DNA and impurity region SNA2. Gate electrodes GA1 and GA2 are supplied with gate signals G0H and G0L, respectively. In sub-decoder element group DGA, also for other sub-decoder elements (SDAn), the same layout is provided, but the supplied source and gate signals are different. In sub-decoder element SDAn, a gate signal GnH is supplied to gate electrode GA1, and a gate signal GnL is supplied to gate electrode GA2.

In sub-decoder element group DGA, a high-side source signal BAiH and a low-side source signal BAiL are supplied to source impurity regions SNA1 and SNA2, respectively. Drain impurity region DNA is coupled to corresponding word line WLi (i=0 to n).

Also in sub-decoder element group DGB, source impurity regions SNB1 and SNB2 are arranged on both sides in the X direction in active region AR, and a drain impurity region DNB is arranged between these impurity regions SNB1 and SNB2. A gate electrode GB1 is arranged between impurity regions SNB1 and DNB, and a gate electrode GB2 is arranged between impurity regions DNB and SNB2. In sub-decoder element group DGB, gate signal G0L is supplied to upper-side gate electrode GB1, and gate signal G0H is supplied to lower-side gate electrode GB2. In a sub-decoder element SABn, gate signal GnL is supplied to upper-side gate electrode GB 1, and high-side gate signal GnH is supplied to lower-side gate electrode GB2.

The sub-decoder elements included in sub-decoder element groups DGA and DGB are arranged in alignment in a Y direction, and gate electrodes GA1, GA2 are arranged in alignment with gate electrodes GB1 and GB2 in the Y direction.

In sub-decoder element group DGB, according to how the gate signals are applied to the gate electrodes, a high-side signal BBiH is supplied to lower source impurity region SNB2, and a low-side source signal BBiL is supplied to upper source impurity region SNB1.

Accordingly, in the writing, even when gate signals G0H to GnH are all set to a high voltage not lower than 20 V, for example, 21 V, a state can be avoided where the high voltage is supplied adjacently to both the corresponding regions in the sub-decoder elements adjacent in the Y direction.

In the configuration shown in FIG. 8, a set of gate signals G0H to GnH, and G0L to GnL is commonly applied to sub-decoder element groups DGA, DGB, and a plurality of (two) word lines are specified by the gate signals. As previously shown in FIG. 2, different sets of gate signals may be applied to the sub-decoder element groups DGA, DGB, respectively. In place of providing two sub-decoder element groups, more columns of sub-decoder element groups may be provided (accordingly, the number of the word lines specified by the gate signals increases).

Figure 9:
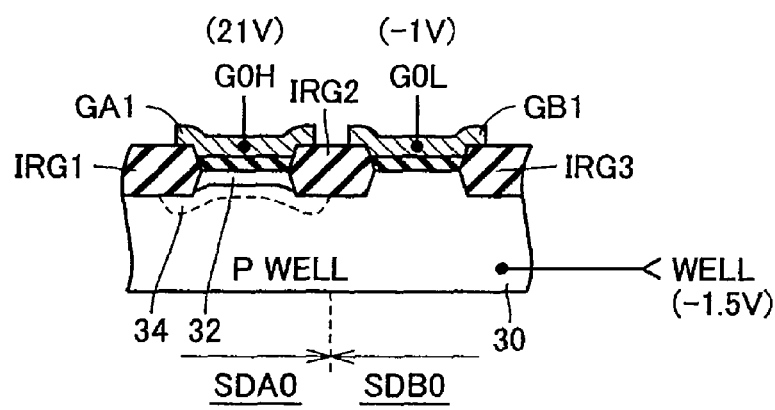
FIG. 9 is a diagram schematically showing a cross-sectional structure along line 9A-9A shown in FIG. 8.

FIG. 9 is a diagram schematically showing a cross-sectional structure taken along line 9A-9A shown in FIG. 8. In FIG. 9, isolation insulating films IRG1, 1RG2 and IRG3 are formed on a surface of a P well 30. By isolation region IRG2, sub-decoder elements SDA0 and SDB0 are electrically separated. Above this P well surface, gate electrodes GA1 and GB 1 are formed with the gate insulating film interposed in between. These gate electrodes GA1 and GB 1 are supplied with gate signals G0H and G0L, respectively.

When gate signal G0H is set to 21 V, for example, at the writing operation, low-side gate signal G0L is set to −1 V. A channel region 32 is formed under gate electrode GA1, and a depletion layer 34 extends to a portion under isolation regions IRD1 and IRD2. A voltage of −1.5 V is supplied to P well 30 as well voltage WELL. Accordingly, formation of a channel inside deletion layer 34 resulting from further extending of depletion layer 34 can be suppressed. This suppresses the formation of a parasitic MOS through formation of an inversion layer under a neighboring isolation insulating film when the high voltage is applied to a gate electrode. For example, formation of the channel under isolation insulating film IRG2 and the resultant flow of leakage current between sub-decoder elements SDA0 and SDB0 through the isolation region are suppressed.

Figure 10:
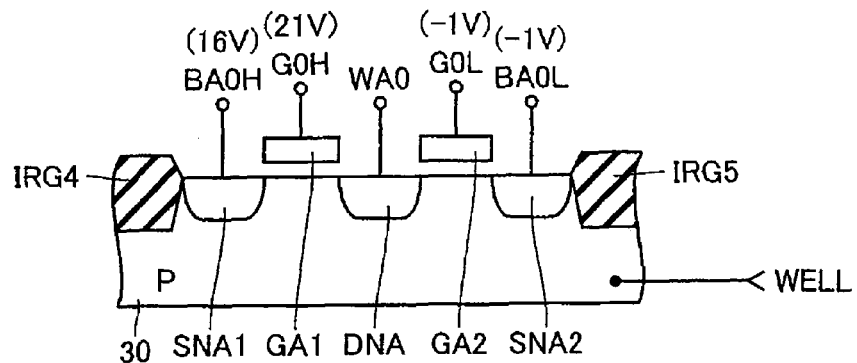
FIG. 10 is a diagram schematically showing a cross-sectional structure along line 10A-10A shown in FIG. 8.

FIG. 10 is a diagram schematically showing a cross-sectional structure along line 10A-10A shown in FIG. 8. In FIG. 10, impurity regions SNA1, DNA and SNA2 are formed apart from one another in a surface of a P well (semiconductor substrate region) 30. Gate electrode GA1 is formed above the well region surface between impurity regions SNA1 and DNA, and gate electrode GA2 is formed above the well region surface between impurity regions DNA and SNA2. Outside impurity regions SNA1 and SNA2, isolation insulating films IRD4 and IRD5 are formed for isolating sub-decoder elements adjacent in the X direction in FIG. 8.

Impurity regions SNA1 and SNA2 are supplied with source signals BA0H and BA0L, respectively, and impurity region DNA is coupled to word line WA0. Gate electrodes GA1 and GA2 are supplied with gate signals G0H and G0L, respectively. P well 30 is supplied with well voltage WELL.

The state where gate signal G0H is set to 21 V, and gate signal G0L is set to −1 V in the writing is now considered. At this time, source signals BA0H and BA0L are 16 V and −1 V, respectively (when word line WA0 is selected).

In this case, in the X direction shown in FIG. 8, a negative voltage (−1 V) is applied to the gate electrode nearest-neighboring to gate electrode GA1 receiving the high voltage (21 V). Accordingly, formation of an inversion layer under isolation region IRG4 or IRG5 is suppressed, so that the leakage in the isolation region is suppressed.

In addition, as shown in FIG. 8, all the sub-decoder elements SD are constructed by N-channel MOS transistors, and active regions AR for forming the element transistors can be all arranged in common P well 30. Accordingly, there is no need for providing a P well and an N well separately, which can reduce an layout area of the sub-decoder circuit. Further, constructing the sub-decoder elements by N-channel MOS transistors can reduce an element (transistor) size from a view point of a transistor parameter in consideration of current driving power, which can reduce a layout area of the transistors more than in a case of a CMOS configuration.

In the arrangement of the sub-decoder elements in the sub-decoder circuit shown in FIG. 8 previously described, the sub-decoder elements are disposed in two columns. In this configuration, a set of two word lines is specified by a set of gate signals GiH, GiL, and one of the two word lines is selected by the source signals. However, these sub-decoder elements may be arranged in four columns or in eight columns, to specify four or eight word lines by a set of gate signals, and to select one of the four or eight word lines by the source signals (BAiH, BBiH, BBiL, BAiL).

Further, in sub-decoder element groups GDA and GDB, different sets of gate signals may be supplied, respectively, and the gate voltages may be controlled individually and separately for the sub-decoder elements.

Modification

Figure 11:
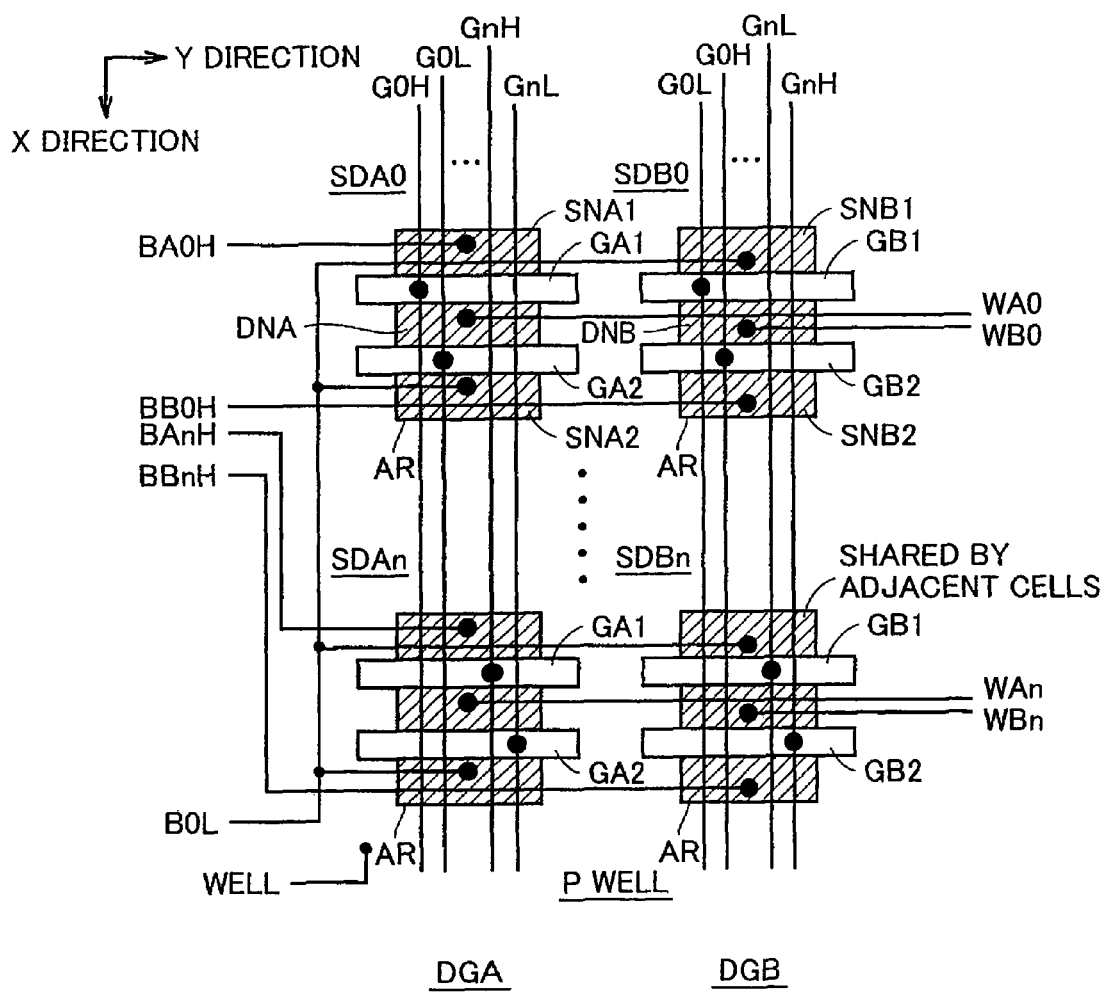
FIG. 11 is a diagram schematically showing a layout of the sub-decoder elements of the sub-decoder circuit according to a modification of First Embodiment of the invention.

FIG. 11 is a diagram schematically showing a configuration of a modification of the sub-decoder circuit of the non-volatile semiconductor memory device according to First Embodiment of the invention. A configuration of the sub-decoder circuit shown in FIG. 11 is different from the arrangement of the sub-decoder circuit shown in FIG. 8 in the following point. In the sub-decoder circuit shown in FIG. 11, a low-side source signal B0L is supplied commonly to sub-decoder elements SDA0 to SDAn and SDB0 to SDBn. Application manner of high-side source signals BA0H to BAnH and BB0H to BBnH is the same as in the decoder circuit shown in FIG. 8. In addition, the layout and arrangement of the transistors of sub-decoder elements SDA0 to SDAn and SDB0 to SDBn are also the same as in the arrangement shown in FIG. 8. Same reference numerals are assigned to corresponding portions of the elements in FIGS. 8 and 11, and the detailed descriptions thereof are not repeated.

In each operation mode, low-side source signal BiL is set to the same voltage level, regardless of selection/non-selection of a corresponding word line. Therefore, in the configuration shown in FIG. 11, even when low-side source signal B0L is supplied commonly to sub-decoder elements SDA0 to SDAn and SDB0 to SDBn, there arises no problem in operation. The sharing of low-side source line signal B0L enables two sub-decoder elements to be arranged in one continuous active region so as to share the low-side source signal (because the high-side source signals cannot be shared). Accordingly, the number of the sub-decoder elements arranged in one active region is increased (four transistors can be arranged), and correspondingly, the number of the isolation regions arranged in the X direction is reduced, which can further reduce the layout area of the sub-decoder circuit.

Figure 12:
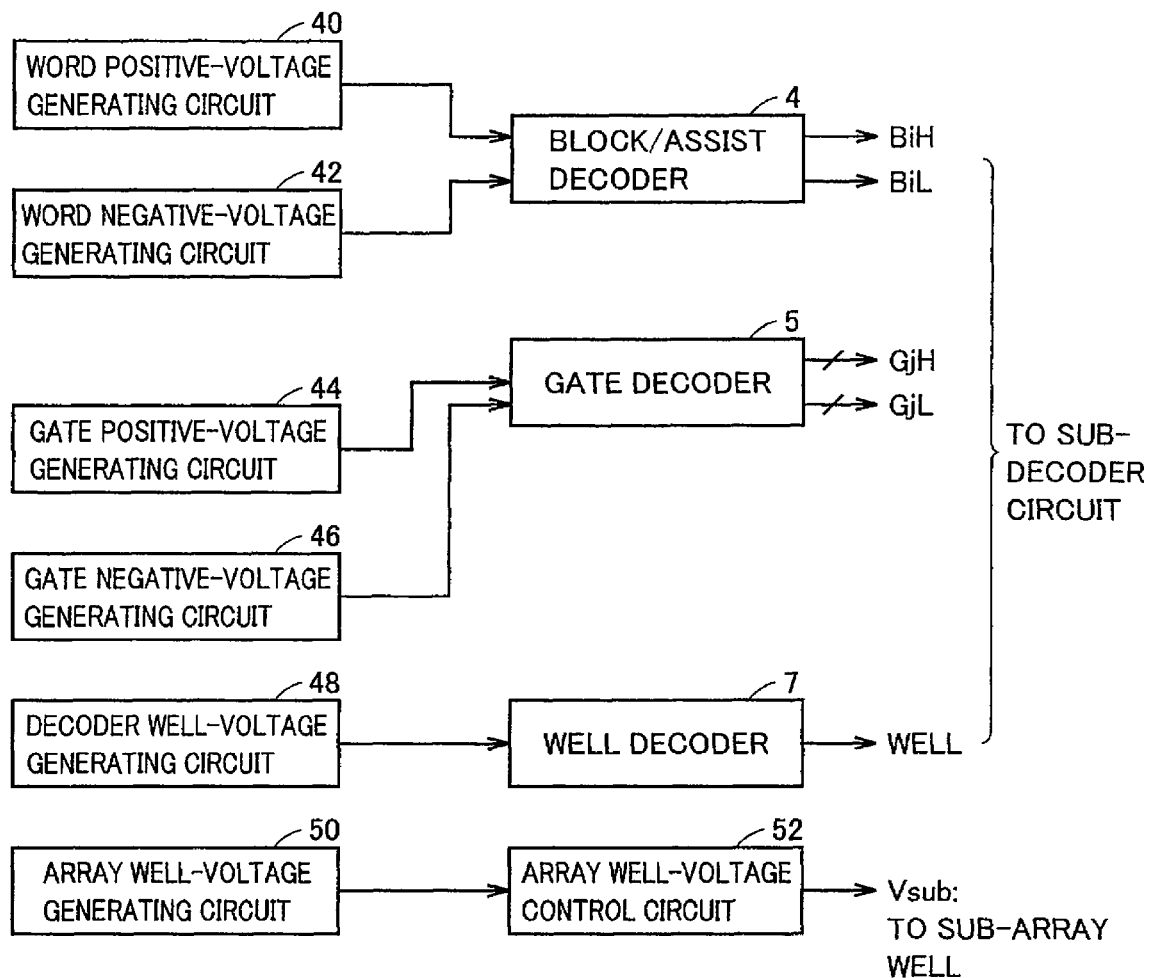
FIG. 12 is a diagram schematically showing a configuration of units that generate voltages for the sub-decoder in First Embodiment of the invention.

FIG. 12 is a diagram schematically showing an example of a configuration of unit that generates voltages related to the sub-decoder circuit. In FIG. 12, a positive voltage from a word positive-voltage generating circuit 40 and a negative voltage from a word negative-voltage generating circuit 42 are supplied to a block/assist gate decoder 4. The positive voltage is a writing high voltage in the writing and a word line read out voltage (3 V and verifying voltage) transmitted to a selected word line in the reading. The negative voltage from word negative-voltage generating circuit 42 is a negative high voltage for erasure applied in the erasure operation, and a negative voltage (−1 V) transmitted to non-selected word lines.

A gate decoder 5 is supplied with a positive voltage from a gate positive-voltage generating circuit 44 and a negative voltage from a gate negative-voltage generating circuit 46. Gate positive-voltage generating circuit 44 transmits a high voltage of 21 V for transmitting a writing high voltage in the programming (writing), a voltage of 3 V for transmitting the negative voltage in the erasure operation, a voltage of 7 V transmitting the word line selection voltage in the reading operation and others.

A well decoder 7 is supplied with a well voltage from a decoder well-voltage generating circuit 48. This decoder well-voltage generating circuit 48 generates a decoder well voltage at a voltage level lower than the negative voltage generated by word negative-voltage generating circuit 42, to set well voltage WELL from well decoder 7 to the voltage level lower than the source potential of the transistors of a sub-decoder element.

Block/assist gate decoder 4 is supplied with a positive voltage from the circuit generating a high voltage of 10 V for turning on the block selection transistor in the block selecting circuit. In addition, internal voltage circuitry for generating voltages applied to the local bit lines and the common source line is further provided separately. The internal voltage circuitry is not shown in the figure because it is not directly related to the voltages applied to the transistor elements of the sub-decoder circuit. FIG. 12, as a representative example of the internal voltage generating circuitry, an array well-voltage generating circuit 50 is shown. Array well-voltage generating circuit 50 generates a voltage applied to an array well in which the memory cells are formed, and this voltage generated by array well-voltage generating circuit 50 is supplied as a well voltage Vsub to the array well region through an array well-voltage control circuit 52. The array well voltage control circuit sets the array well voltage of a corresponding memory block in accordance with the operation mode and the block selection signals.

Source signals BiH and BiL from block/assist gate decoder 4 and well voltage WELL from well decoder 7 are supplied to the sub-decoder circuit included in a corresponding memory block, and gate signals qH and qL from gate decoder 5 are supplied to each memory block sub-decoder circuits in common.

As described above, according to First Embodiment of the invention, the sub-decoder element is constructed by N-channel MOS transistors in the decoder circuit that sets the voltage level of the word lines, and the well voltage of the sub-decoder circuit is set to a voltage level lower than the source (node to which the source signal is supplied) potential of the transistors of the sub-decoder element. Thus, even when high voltage is applied for the gate voltage, by adjusting the well voltage of the decoder, the leakage in the isolation regions of the sub-decoder elements can be reduced.

In addition, the transistors of the sub-decoder elements are arranged such that the first and second N-channel transistors are adjacent and aligned in the Y direction by exchanging the positions of the transistors in the adjacent sub-decoder columns. Accordingly, the concurrent application of high voltages to the nearest neighboring gates can be prevented. This can suppress the formation of an inversion layer under the isolation region.

Second Embodiment

Figure 13:
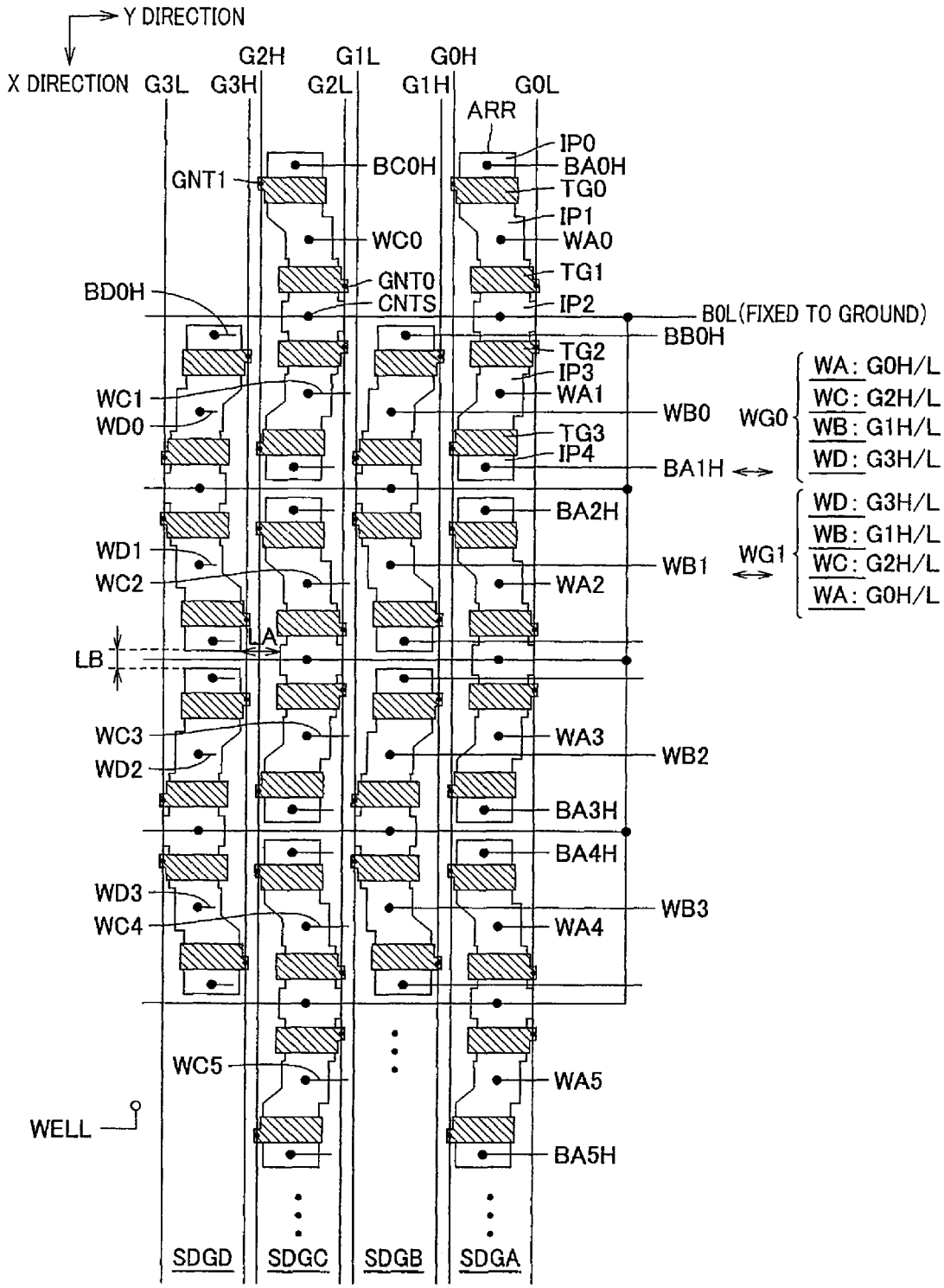
FIG. 13 is a diagram schematically showing a layout of sub-decoder elements of a sub-decoder circuit according to Second Embodiment of the invention.

FIG. 13 is a diagram showing an example of arrangement of sub-decoder elements of a sub-decoder circuit according to Second Embodiment of the invention. The sub-decoder circuit shown in FIG. 13 is provided for one memory block, and includes sub-decoder element groups SDGA, SDGB, SDGC and SDGD arranged in four columns.

To sub-decoder element group SDGA, gate signal lines G0L and G0H are arranged continuously extending along an X direction. To sub-decoder element group SDGB, gate signal lines G1H and G0L are arranged continuously extending in the X direction. To sub-decoder element-group SDGC, gate signal lines G2L and G2H are arranged continuously extending in the X direction. To sub-decoder element group SDGD, gate signal lines G3H and G3L are arranged continuously extending in the X direction. The sub-decoder elements of each of sub-decoder element groups SDGA, SDGB, SDGC, and SDGD are arranged in alignment in a region delineated by the corresponding gate lines substantially linearly (within a range of the displacement of the width of gate electrodes). Here, the gate signals and the signal lines that transmit the gate signals are indicated by the same reference characters.

In each of the sub-decoder element groups SDGA to SDGD, a chevron-shaped (ridged-shaped) active region ARR in which four N-channel MOS transistors are formed is arranged successively and repeatedly. Active region ARR includes an impurity region IP0 that receives a high-side source signal, an impurity region IP1 that is coupled to a corresponding word line, an impurity region IP2 that receives low-side source signal B0L fixed to the ground, an impurity region IP3 that is coupled to another word line, and an impurity region IP4 that receives a high-side source signal corresponding to the another word line. In FIG. 13, as one specific example, for active region ARR, high-side source signal BA0H is supplied to impurity region IP0, impurity region IP1 is coupled to word line WA0, impurity region IP2 receives low-side source signal B0L, impurity region IP3 is coupled to a word line WA1, and impurity region IP4 receives another high-side source signal BA1H.

A gate electrode TG0 is arranged between impurity regions IP0 and IP1, and a gate electrode TG1 is arranged between impurity regions IP1 and IP2. A gate electrode TG2 is arranged between impurity regions IP2 and IP3, and a gate electrode TG3 is arranged between impurity regions IP3 and IP4.

In active region ARR, the impurity regions and the gate electrodes are arranged mirror symmetrically with respect to impurity region IP2 that receives low-side source signal B0L. Two sub-decoder elements can be arranged in one active region so as to share impurity region IP2 that receives the low-side source signal.

A layout area of impurity regions IP1 and IP3 coupled to the word lines is made large for the following reasons. N+diffusion layers (source/drain regions) are spaced away from electrode ends of gate electrodes TG0, TG1 and TG2, TG3, to increase a breakdown voltage between the source and the drain of the transistor. Similarly, an area of impurity region IP2 that receives low-side source signal B0L is made larger, for increasing the distance between the N+diffusion layer and the ends of gate electrodes TG1 and TG2, to increase a breakdown voltage between the source and the drain of the transistor.

In the chevron-shaped active region ARR, gate electrodes TG1 and TG2 are coupled to gate signal G0L through contacts GNT0 in a portion projected in a Y direction (a top portion of the chevron), and high-side gate signal G0H is coupled to gate electrodes TG0 and TG3 arranged in bottom portions of this chevron-shaped active region ARR through contacts GNT1.

Gate signal lines G0L, G0H to G2L, G2H are arranged such that high-side gate signals or low-side gate signals are adjacent and alternately.

In sub-decoder element groups SDGA to SDGD, active regions ARR are arranged being displaced by half of the active region in the Y direction with the layout being inverted in the Y direction in sub-decoder element groups adjacent in the Y direction. Accordingly, impurity region 11P2 that receives low-side source signal B0L of each of sub-decoder element groups SDGB and SDGD is arranged corresponding to the position of an isolation region between any active regions of each of sub-decoder element groups SDGA and SDGC.

In the arrangement of the sub-decoder elements shown in FIG. 13, in the sub-decoder elements adjacent in the Y direction, gate electrodes TG2 and TG0 are arranged adjacently. That is, in the sub-decoder elements adjacent in the Y direction, the gate electrode of the first N-channel MOS Transistor and the gate electrode of the second N-channel MOS transistor are arranged adjacently. Accordingly, the low-side gate signal is applied to the gate electrode (gate electrode of the sub-decoder element adjacent in the Y direction) nearest neighboring the gate electrode to which a high voltage of 20 V or higher is applied in the writing, and is set to a negative voltage lower than 0 V. Accordingly, even when an inversion layer extends under the isolation region between the gate electrodes adjacent in the Y direction by the high voltage in the writing, the voltage lower than 0 V (−1 V or the like) is applied to the other gate electrode, so that the current flowing path of the parasitic MOS transistor is shut off (the channel is not formed under the gate electrode that receives the low-side gate signal), and leakage current in the isolation between the gates can be suppressed.

In addition, in this case, well voltage WELL is set to a voltage level lower than the source voltage of the low potential (in the writing, for example −1.5 V). A back-gate bias effect of the well potential suppresses the formation of a channel (inversion layer) under the isolation insulating film, and accordingly, leakage current through the isolation regions between the active regions and between adjacent gate electrodes.

By setting the well voltage WELL to a lower voltage level than the source voltage of the low potential to provide the back-gate bias effect to each N-channel MOS transistor, a distance LA between the active regions adjacent in the Y direction can be reduced down to 0.7 μm or lower, that is, around 0.3 μm (when the high voltage in the writing is 20 V or higher). Also, a distance LB between the active regions adjacent in the X direction can be reduced to around 0.3 μm, which is not larger than 0.7 μm. When the source and the well are set to the same potential, these distances LA and LB can be decreased down to about 0.7 μm at most.

Further, since the contacts CNTS that receive low-side source signal B0L are arranged substantially linearly in alignment in the Y direction, the interconnection layout is simplified, and the same layout pattern can be arranged repeatedly in the X direction, and therefore, the sub-decoder elements can be arranged at a high density, resulting in reduced layout area of the sub-decoder circuit.

Further, by forming the active region ARR into a chevron form, a necessary transistor size can be assured with the least minimum area in the X direction, and the layout area of the sub-decoder elements can be reduced.

Furthermore, in each of the sub-decoder element groups SDGA to SDGD, the gate electrodes TG0 to TG3 are arranged in alignment substantially in one column along the X direction within a range of a width of gate electrodes, which can reduce a width of the sub-decoder element group in the Y direction, and reduce the layout area of the sub-decoder elements. The impurity region that receives low-side source signal B0L is shared by two sub-decoder elements adjacent in the X direction, and there is no need for providing an isolation region for each of the sub-decoder elements, and for providing a contact for the low-side source signal for each sub-decoder element, so that the layout area of the sub-decoder elements can be further reduced.

Figure 14:
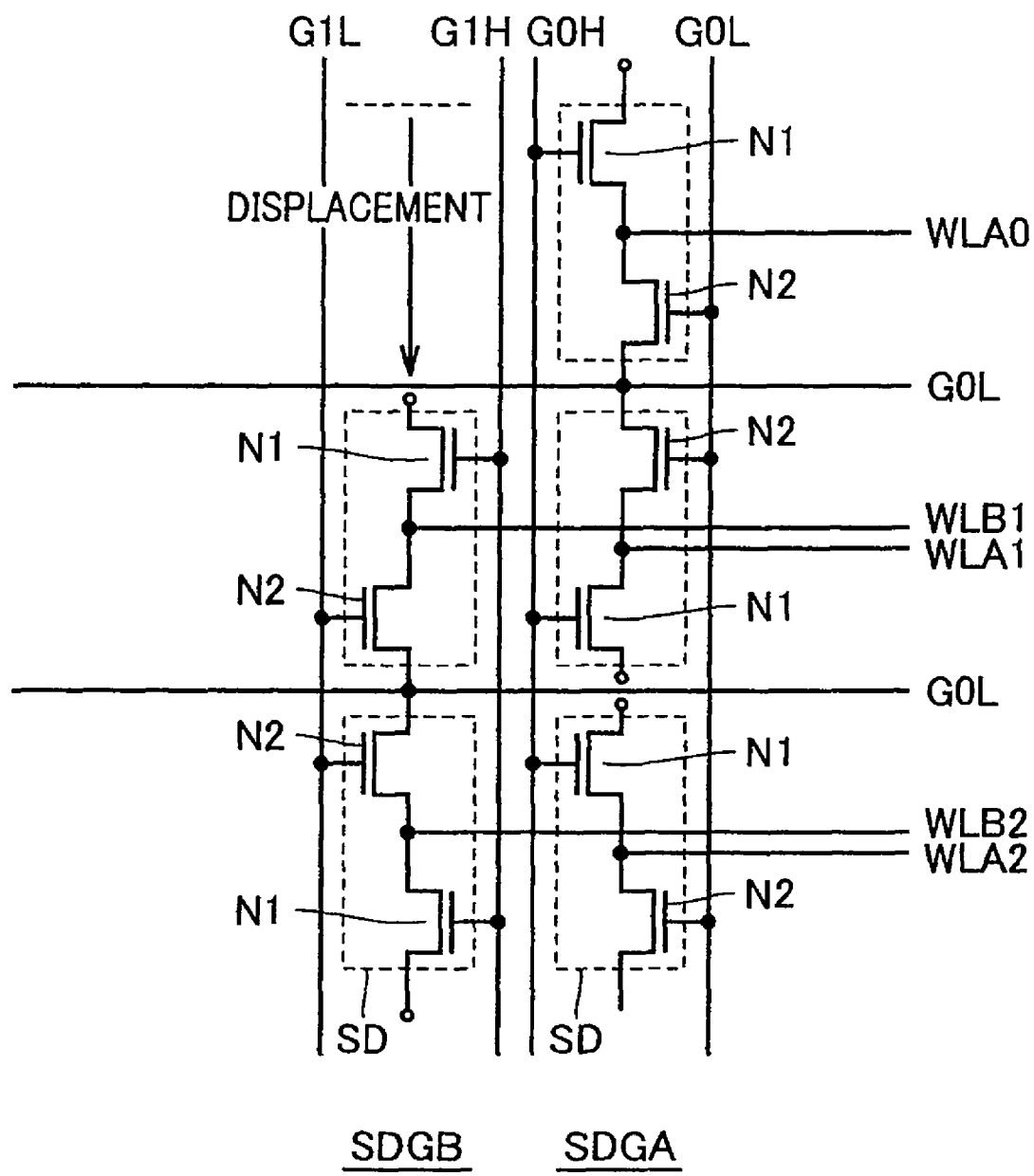
FIG. 14 is a diagram showing an electrical equivalent circuit of an arrangement of the sub-decoder elements shown in FIG. 13.

FIG. 14 is a diagram showing an electrical equivalent circuit of the layout of the sub-decoder elements shown in FIG. 13. In FIG. 14, the sub-decoder elements SD in sub-decoder element groups SDGA and SDGB are representatively shown. In the sub-decoder element group SDGA, first and second N-channel MOST transistors N1 and N2 are arranged symmetrically with respect to low-side source signal line G0L. In sub-decoder element group SDGB, the layout of its active regions is displaced by one sub-decoder element SD, and the positions of the gate electrodes are inverted with respect to the gate signal lines, as compared with the layout of sub-decoder element group SDGA.

Gate signal lines G0H and G1H are arranged adjacently, and low-side gate signal lines G0L and G1L are arranged outside and being opposed with respect to corresponding sub-decoder element groups SDGA, SDGB. Accordingly, in the sub-decoder group SDGA, when gate signal G0H is set to a high voltage (20 V or higher), the nearest neighboring gate electrode is the gate electrode of second N-channel MOS transistor N2, in the sub-decoder element group SDGB, the potential of which is 0 V or lower (0 V or −1 V).

Even when high-side gate signal G1H is set to a high voltage level in sub-decoder element group SDGB, the transistor nearest neighboring the first N-channel MOS transistor N1 is second N-channel MOS transistor N2 in sub-decoder element group SDGA, the gate electrode potential of which is 0 V or lower.

Thus, the transistors receiving a high voltage at their gate electrodes can be prevented from being adjacently arranged in the sub-decoder element groups adjacent in the Y direction in FIG. 13. Accordingly, the leakage via the isolation region can be suppressed.

By arranging the contacts for the gate electrodes in opposite ends of the gate electrodes in the sub-decoder element, the layout of the gate signal lines is made easier and the interconnection layout area can be reduced even when the transistors of the sub-decoder element are arranged symmetrically in one active region. In addition, the gate signal lines can be arranged extending linearly, and the interconnection layout can be made easier.

In the configuration of the sub-decoder circuit shown in FIG. 13, one word line is selected in a group WG0 of four word lines WA to WD, and one word line in a group WG1 of four word lines WD, WB, WC and WA by gate signals G0H/L (G0K, G0L), G2H/L, G0H/L, G3H/L. The selected group of the word lines is determined by the source signals.

In the sub-decoder circuit shown in FIG. 13, two sub-decoder elements are arranged symmetrically (in the X direction) in an active region, and thus, the disposed order of the word lines are in the sequence of WA, WC, WB, WD, WD, WB, WC, and WA. Word line groups WG0 and WG1 are made symmetric in the disposed order of the word lines and are arranged alternately.

In Second Embodiment, transistors N1, N2 of the sub-decoder element are each constructed of a single-gate, high-voltage transistor having a thick insulating film.

The high voltage in the writing only needs to be at a voltage level higher than the high voltage transmitted to a selected word line (for example 16V) by a threshold voltage of the first N-channel MOS transistor, and as described above, even in the case of a condition of the writing high voltage of 20 V, the writing voltage of 16 V can be transmitted to a selected word line.

A configuration may be used in which for the sub-decoder elements provided for one word line group, a common high-side source signal is supplied.

As described above, according to Second Embodiment of the invention, the sub-decoder elements are arranged such that a high voltage of 20 V or higher is not applied to the adjacent gate electrodes concurrently, and further the sub-decoder elements are arranged such that 0 V or lower (−1 V or the like) is applied to the gate electrode nearest neighboring the gate electrode to which the high voltage (20 V or higher) is applied. Specifically, between the sub-decoder element groups in the Y direction, the active regions are arranged being displaced by one sub-decoder element, and the well potential is adjusted independently of the gate and source potentials. Accordingly, the leakage via the isolation region due to the parasitic MOS can be suppressed, and accordingly the distances between the active regions can be reduced in the X direction and in the Y direction, so that the sub-decoder elements can be miniaturized.

Third Embodiment

Figure 15:
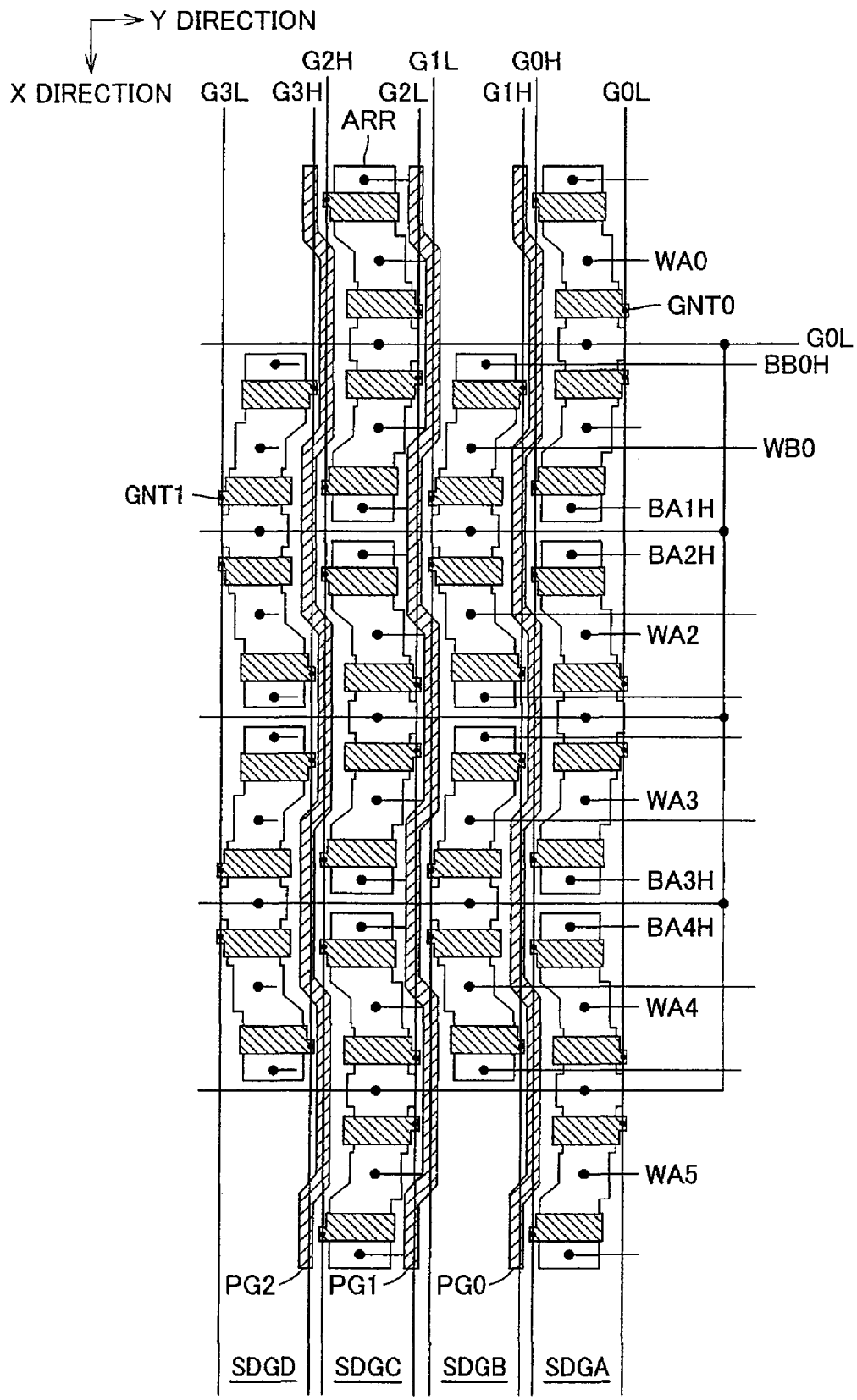
FIG. 15 is a diagram schematically showing the arrangement of sub-decoder elements of a sub-decoder circuit according to Third Embodiment of the invention.

FIG. 15 is a diagram schematically showing a layout of a sub-decoder circuit according to Third Embodiment of the invention. The sub-decoder circuit shown in FIG. 15 is different from the sub-decoder circuit shown in FIG. 13 in the following configuration. On isolation regions between active regions ARR forming sub-decoder element groups SDGA, SDGB, SDGC and SDGD, in a Y direction, shield interconnections PG0, PG1 and PG2 are arranged, respectively and are fixed to the ground voltage or a low potential (positive or negative). The shield interconnection PG is formed of an interconnection at the same layer as that of gate electrodes of the transistors of sub-decoder elements.

The other arrangement of the layout of the sub-decoder circuit shown in FIG. 15 is the same as the arrangement of the sub-decoder circuit shown in FIG. 13, and therefore, in FIG. 15, reference characters of corresponding elements in the sub-decoder element group SDGA are shown representatively, and the detailed descriptions thereof is not repeated.

In the writing, in the sub-decoder circuit group, high voltages are applied to a gate electrode and to a source region of a first N-channel MOS transistor of the sub-decoder element. The writing high voltage is also supplied to an interconnection arranged above the gate electrode for transmitting the writing high voltage to the gate electrode. Signal lines that transmit the high voltage, or high-side source signal line and high-side gate signal line, are arranged extending over the isolation region. Accordingly, there is a possibility that a parasitic MOS is generated in the isolation region due to the signal lines (source signal line and gate signal line) transmitting this high voltage. In order to eliminate the generation of parasitic MOS due to an upper layer interconnection, shield layers PG0 to PG2, of which potential is fixed to the ground voltage or a lower potential (positive or negative low potential), are arranged to avoid an effect of the high voltage on the isolation regions between the sub-decoder element groups and to prevent leakage in the isolation regions at the time of miniaturization of the components (transistors).

Figure 16:
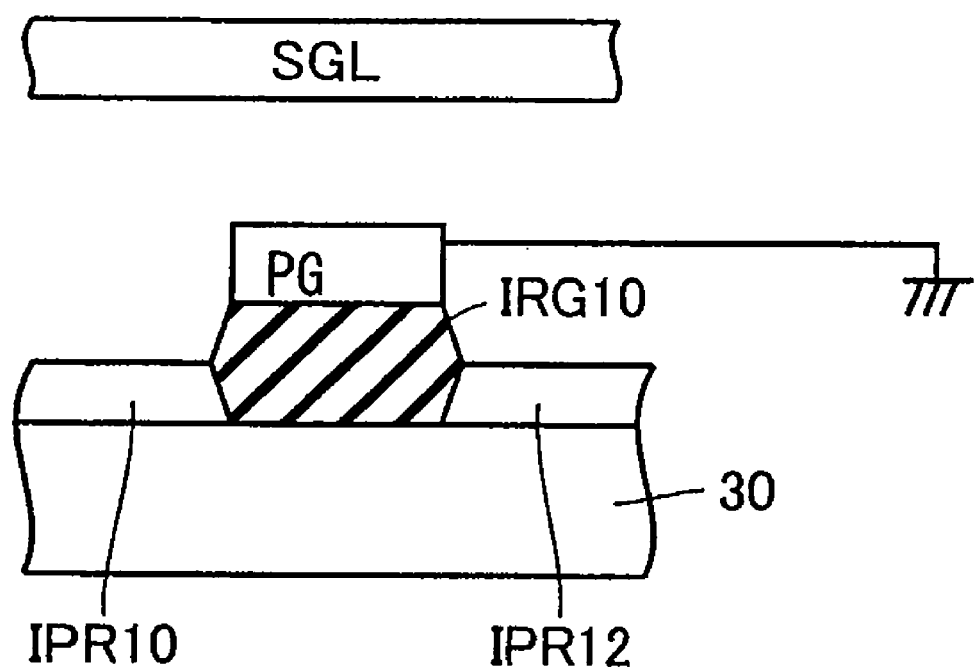
FIG. 16 is a diagram schematically showing a cross-sectional structure of a shield interconnection portion shown in FIG. 15.

FIG. 16 is a diagram schematically showing a cross-sectional structure of the shield interconnection in an isolation region portion.

In FIG. 16, impurity regions IPR10 and IPR12 are formed on a substrate region 30 surface, and a field insulating film IRG10 (element isolation film) is formed between impurity regions IPR10 and IPR12. Above isolation region IRG10, shield interconnection PG is provided, and shield interconnection PG is fixed to a low potential of the ground voltage, for example. Above shield interconnection PG, a signal line SGL that transmits the high voltage is arranged. Accordingly, even when the high voltage of 20 V or higher, for example, is applied to signal line SGL, an electric field to isolation insulating film IRG10 is alleviated by shield interconnection PG fixed to the fixed potential, and the formation of an inversion layer under the isolation insulating film IRG10 can be suppressed.

By constructing the shield interconnection PG by an interconnection of the same interconnection layer as the gate electrode, an electric field from the gate electrode of the sub-decoder element can also be suppressed, to suppress the generation of the parasitic MOS when the high voltage is applied.

In FIG. 16, the case where shield interconnection PG is fixed to the ground voltage is shown as an example. However, the shield interconnection PG only needs to be fixed to a low potential (positive or negative) to provide a shielding function against the electric field generated by the upper layer signal line SGL that transmits the high voltage. Accordingly, by forming the shield interconnection using an interconnection of the same interconnection layer as the gate electrode, there is no need for providing an interconnection dedicated to shielding separately, and accordingly, an increase of the number of interconnection layers can be suppressed. However, if an interconnection of a different interconnection layer from the gate electrode can be utilized, such interconnection layer can be utilized for forming the shield interconnections.

The shielding interconnection does not need to be arranged for all the isolation regions between the sub-decoder element groups. The shielding interconnection may be arranged every other isolation region or for each plurality of isolation regions along the Y direction. The shield interconnection extending along the X direction may be arranged. It is sufficient for an interconnection to be able to alleviate an electric field from an upper layer interconnection.

As described above, according to Third Embodiment of the invention, the shield interconnection biased to a fixed potential is arranged on the isolation regions between the sub-decoder element groups, so that in addition to the effect of Second Embodiment, the generation of the parasitic MOS in the isolation regions can be suppressed and even upon miniaturization of transistors, the effect of the parasitic MOS can be further suppressed.

Fourth Embodiment

Figure 17:
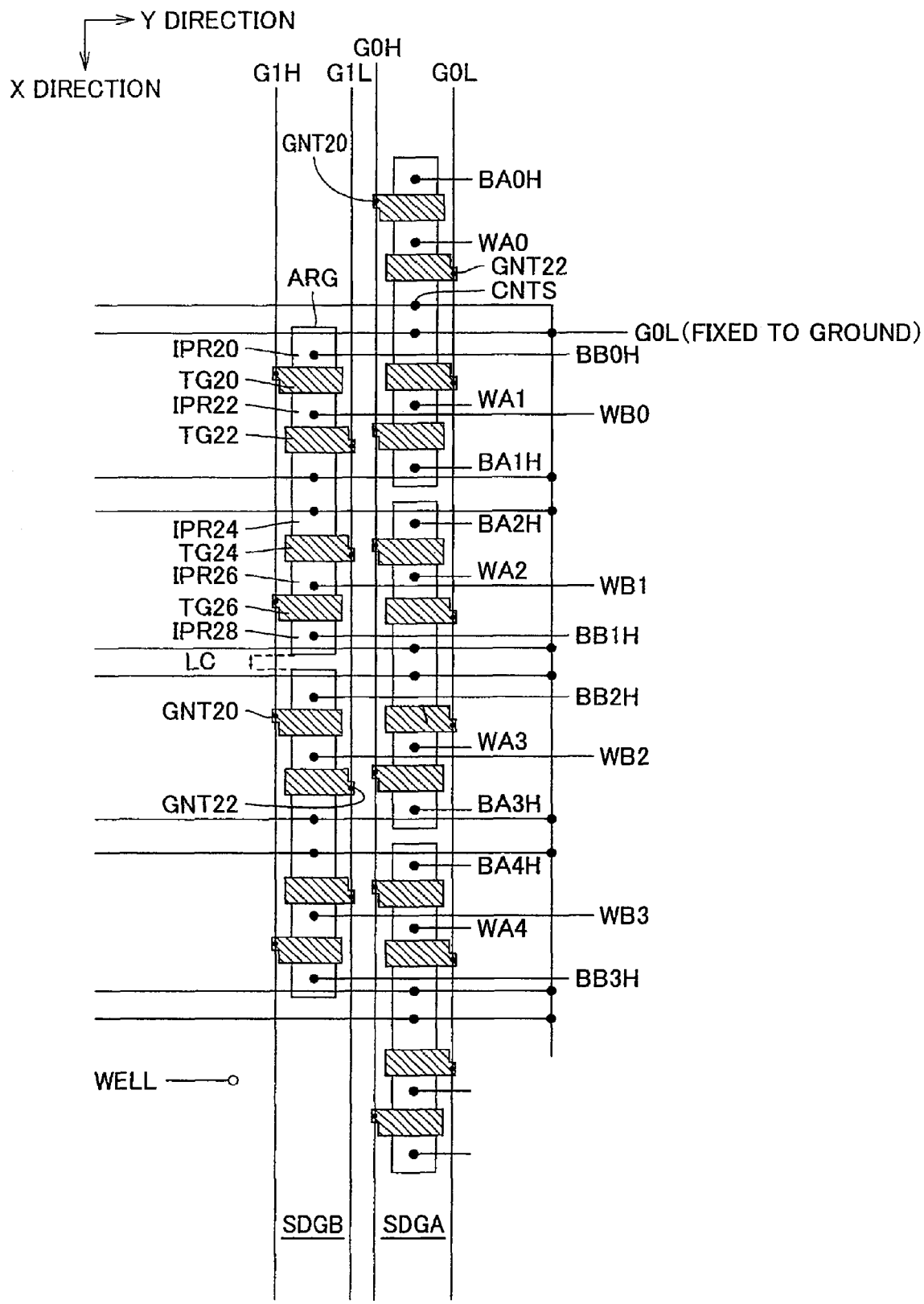
FIG. 17 is a diagram schematically showing a layout of sub-decoder elements of a sub-decoder circuit according to Fourth Embodiment of the invention.

FIG. 17 is a diagram schematically showing the arrangement of sub-decoder elements of a sub-decoder circuit according to Fourth Embodiment of the invention. In the sub-decoder circuit shown in FIG. 17, two sub-decoder element groups SDGA and SDGB are shown. In each of sub-decoder element groups SDGA and SDGB, an active region ARG, in which two sub-decoder elements are formed, are provided. Active regions ARG each include an impurity region IPR20 that receives a high-side source signal (BB0H), an impurity region IPR22 that is coupled to a word line (WB0) an impurity region IPR24 that receives a low-side source signal B0L, an impurity region IPR26 that is coupled to another corresponding word line (WB1), and an impurity region IPR28 that receives a high-side source signal (BB1H) corresponding the another word line.

On both sides of each of impurity regions IPR22 and IPR26, gate electrodes TG20, TG22 and TG24, TG26 are arranged, respectively. Gate electrodes TG20, TG22 are provided with gate contacts GNT20 and GNT 22 at ends opposite in a Y direction. In sub-decoder element group SDGB, gate contact GNT 22 is supplied with low-side gate signal (G1L), and gate contact GNT 20 is supplied with high-side gate signal G1H. In sub-decoder element group SDGA, gate contact GNT20 is supplied with high-side gate signal G0H, and gate contact GNT 22 is supplied with low-side gate signal G0L.

Sub-decoder element groups SDGA and SDGB are arranged with displacement of one sub-decoder element in an X direction. The layout is not inverted between sub-decoder element groups SDGA and SDGB.

In sub-decoder element group SDGA, high-side source signals BA0H to BA4H are supplied to impurity regions IPR20, IPR28 on both ends of active region ARG in the X direction, respectively, and according to gate signals G0L and G0H, word lines WA0 to WA3 are selectively driven into a selected state.

In sub-decoder element group SDGB, according to gate signals G1H and G1L and high-side source signals BB0H to BB3H, word lines WB0 to WB3 are selectively driven into a selected state.

In the arrangement shown in FIG. 17, active regions ARG are each formed linearly, and a layout area in the Y direction can be reduced. Gate electrodes TG20, TG22, TG24 and TG26 are arranged in alignment in the Y direction in accordance with the arrangement of active regions ARG. Impurity regions IPR24 to which source contacts are formed, are arranged in alignment along the Y direction (in the case where sub-decoder element groups are provided in three columns and more), so that sub-decoder elements can be arranged at a high density.

By arranging the gate contacts in the opposite ends of sub-decoder elements in the Y direction, the gate signal interconnection can delineate a region where the sub-decoder elements are arranged, and accordingly, the interconnection layout of the gate signals can be simplified.

Even in the case where linear, rectangular active regions ARG are utilized, the sub-decoder elements can also be arranged with a least minimum layout, as far as breakdown voltage and current driving power (a ratio of a channel width to a channel length) of the transistor elements can be assured.

Also in this arrangement shown in FIG. 17, by setting a well voltage and the source signal of the low potential to −1 V or lower, the leakage at a parasitic MOS between the active regions of the sub-decoder element groups can be suppressed. In addition, an interval of the active regions adjacent in the Y direction in the sub-decoder element groups can be reduced to around 0.3 μm. Similarly, in the X direction, as shown in FIG. 17, a distance LC between the adjacent active regions can also be reduced down to 0.3 μm.

Also in this arrangement of the sub-decoder elements shown in FIG. 17, similarly to Third Embodiment, −1 V is supplied to the gate electrode (gate adjacent in the X direction) nearest neighboring the gate electrode receiving the high voltage, and in the writing, the state where the gate electrodes to which the high voltage is applied are adjacent (in the Y direction) can be prevented, and the leakage due to the parasitic MOS in the isolation region can be suppressed.

In the sub-decoder circuit shown in FIG. 17, the sub-decoder element groups may be arranged in four columns or more in the Y direction, similarly to Third Embodiment previously described.

In addition, in the configuration shown in FIG. 17, in impurity region IPR 24 receiving low-side source signal G0L, a region for two transistor elements is assured (two contacts are provided). However, in the case where impurity region IPR24 is shared by adjacent second MOS transistors, an area of impurity region IPR24 can be reduced to an area of the impurity region for one transistor element, and accordingly, a layout area of the sub-decoder elements can be further reduced.

Consequently, in the case of this arrangement, by arranging high-side gate signal GiH and low-side gate signal G(i+1)L adjacently, the state where the high voltage is applied to the gate electrode nearest neighboring the gate electrode to which the high voltage is applied, is prevented (−1 V is applied), and the leakage due to a parasitic MOS can be suppressed.

In the layout shown in FIG. 17, as for the layout of active regions ARG in the sub-decoder elements, active regions ARG are arranged with displacement of one sub-decoder element in the X direction (the inversion of the layout as done in Third Embodiment is not performed). However, in Fourth Embodiment also, between sub-decoder element groups SDGA and SDGB, such a layout may be used, in which active regions ARG are displaced by one sub-decoder element group and the operation of inverting the layout of the transistors is performed. In this arrangement, in the gate signals in the sub-decoder element group, high-side gate signals G0H and G1H are arranged adjacently. Thereby, in the gate electrodes adjacent in the Y direction, one is supplied with the high-side gate signal and the other is supplied with low-side gate signal, and accordingly, generation of the parasitic MOS can be reliably suppressed.

In the arrangement shown in FIG. 17, similarly to the previously described Third Embodiment, shielding interconnection may be arranged on an isolation region between sub-decoder element groups SDGA and SDGB. The arrangement of this shield interconnection allows a parasitic MOS to be more reliably avoided.

As described above, according to Fourth Embodiment of the invention, the active regions are arranged linearly, and the occurrence of the state where the high voltage is applied to both adjacent gate electrodes in adjacent sub-decoder groups is avoided, which can miniaturize the sub-decoder elements while suppressing the generation of the parasitic MOS.

Fifth Embodiment

Figure 18:
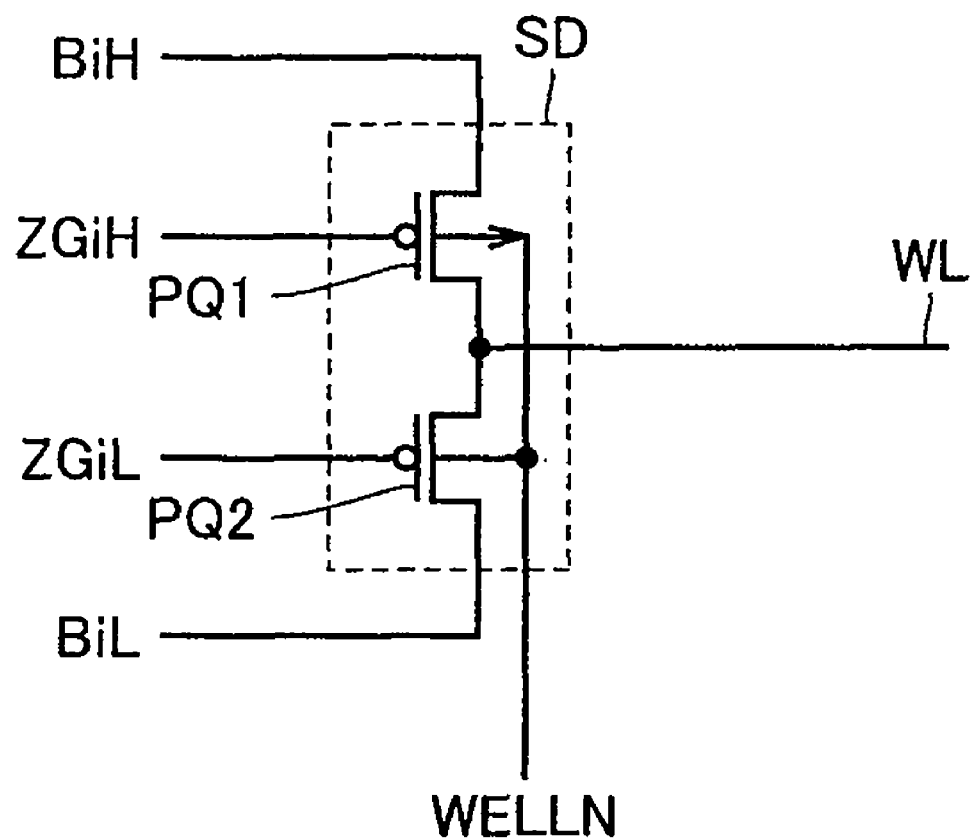
FIG. 18 is a diagram showing an electrical equivalent circuit of a configuration of sub-decoder elements according to Fifth Embodiment of the invention.

FIG. 18 is a diagram showing an electrical equivalent circuit of a configuration of a sub-decoder element according to Fifth Embodiment of the invention. FIG. 18, sub-decoder element SD is constructed by two P-channel MOS transistors PQ1 and PQ2. Source signal BiH is supplied to a source terminal of MOS transistor PQ1, and low-side source signal BiL is supplied to a source of MOS transistor PQ2. Drains of MOS transistors PQ1 and PQ2 are connected together to a word line WL1. In addition, gate signals ZGiH and ZGiL are supplied to gates of these MOS transistor PQ1 and PQ2.

These P-channel MOS transistors PQ1 and PQ2 are constructed of the same high voltage transistors each having a thick gate insulating film as in First to Fourth Embodiments.

As shown in FIG. 18, in the case where sub-decoder element SD is constructed by P-channel transistors PQ1 and PQ2, as a well region, not a P well but an N well is used. A well voltage WELLN of the N well region is maintained at a voltage level higher than a source potential of the transistors of the sub-decoder element. This high voltage suppresses the formation of a parasitic MOS by a back-gate bias effect without increasing an impurity concentration under an isolation region.

The parasitic MOS is formed on an N well surface if and when a negative high voltage is applied to the gate of the transistor of a sub-decoder element. Accordingly, in the erasure mode, when −18 V, for example, is transmitted to word line WL, if source signal BiH is fixed to −18 V and source signal BiL is fixed to the ground voltage level, gate voltage ZGiH is set to −20 V or lower (for example, −21 V) and the gate signal ZGiL is set to 1V, for example. At this case, well voltage WELLN is set to a voltage level higher than the source potential of the high potential (for example, 1.5 V to 2 V). This can suppress the formation of an inversion layer under an isolation region, to suppress the generation of the parasitic MOS.

In the case where a positive high voltage is transmitted to word line WL, that is, in the writing mode, when source signal BiH is set to 16 V, source signal BiL is maintained at the ground voltage level, gate signal ZGiH is set to the ground voltage, and gate signal ZGiL is set to a voltage level a little higher than 16 V (for example, 17 V). In this case, well voltage WELLN is set to a voltage higher than the high source potential (16 V), of about 16.5 V or 17 V, for example.

In the reading mode, in the case where 3 V is transmitted to word line WL, gate voltage ZGiH is set to the ground voltage, and source signal BiH of 3 V level is transmitted, and further, gate signal ZGiL is set to a voltage level of 3 V or 4 V. In this case, well voltage WELLN is set to a voltage level higher than the source voltage of the high potential (for example, 3.5 V or 4 V).

When P-channel MOS transistors PQ1 and PQ2 are utilized for components of the sub-decoder element, an element area is made a little larger than that in the case where N-channel MOS transistors are utilized, in consideration of current driving power. However, in the case where these P-channel MOS transistors are utilized in sub-decoder element, by utilizing the layout as described in the foregoing First to Fourth Embodiments, even upon miniaturization of the components, the leakage through the parasitic MOS in the isolation region can be similarly suppressed, and the sub-decoder element having a small occupation area can be achieved.

By applying the invention to an AG-AND type flash memory utilizing an assist gate, even in the environment where high voltage (voltage having a large absolute value) is utilized, the leakage current in the sub-decoder elements can be suppressed, and a nonvolatile semiconductor memory device with a small occupation area and low current consumption can be achieved.

The nonvolatile semiconductor memory device is not limited to the AG-AND type flash memory utilizing an assist gate. The present invention can be applied to a nonvolatile semiconductor memory device having a hierarchical decoding configuration of driving a word line by a combination of the gate signals and the source signals, with which a layout area can be reduced without deteriorating characteristics of the elements of a sub-decoder circuit.

Further, the nonvolatile semiconductor memory device may be a memory device of a chip alone, or may be a memory device that is integrated with another logic such as a processor on the same semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a memory array including a plurality of memory cells arranged in rows and columns;
    a plurality of word lines arranged corresponding to the respective memory cell rows and connecting to memory cells on corresponding rows;
    a subdecode circuit including subdecode elements arranged corresponding to the word lines, for setting voltages on word lines in accordance with a set of source signals and a set of gate signals;
    a block decode circuit for producing the source signals in accordance with an address signal; and
    a gate decode circuit for producing the gate signals in accordance with the address signal;
    each of the subdecode elements including;
    first and second transistor of a common conductivity type each having a gate, a source and a drain, the first and second transistors receiving first and second gate signals produced from said gate decode circuit at the respective gates, and receiving first and second source signals produced from said block decode circuit at the respective sources, and the drains of the first and second transistors connected commonly to a corresponding word line, and
    said subdecode elements being arranged aligned in plural lines in such a manner that no nearest neighboring gates receive a high voltage for data writing or erasure concurrently.

2. The nonvolatile semiconductor memory device according to claim 1, wherein the subdecode elements are arranged alignedly in a first direction with an overlapping within a ranged of a width of the gate electrodes constituting the gates.

3. A nonvolatile semiconductor memory device comprising:
    a memory array including a plurality of memory cells arranged in rows and columns;
    a plurality of word lines arranged corresponding to the memory cell rows and connecting to the memory cells on corresponding rows;
    a sub decode circuit including subdecode elements arranged corresponding to the respective word lines, for setting voltages on the word lines in accordance with a set of source signals and a set of gate signals;
    a block decode circuit for producing the source signals in accordance with an address signals; and
    a gate decode circuit for producing the gate signals in accordance with the address signals;
    each of the subdecode elements including;
    first and second transistors of a common conductivity each having a gate, source and a drain, the first and second transistors receiving first and second gate signals produced from the gate decode circuit at the respective gates, and receiving first and second source signals produced from said block decode circuit at the respective source, and having the drains commonly connected to a corresponding word line,
    the subdecode elements being arranged such that a nearest neighboring gate to a gate receiving a high voltage for data writing or erasure receives a voltage different in polarity from the high voltage.

4. The nonvolatile semiconductor memory device according to claim 3, wherein the subdecode elements are arranged alignedly in a first direction with an overlapping within a range of a width of gate electrodes constituting the gates.

* * * * *